(12) United States Patent
Onoda

(10) Patent No.: US 9,054,185 B2
(45) Date of Patent: Jun. 9, 2015

(54) SEMICONDUCTOR DEVICE

(71) Applicant: FUJITSU SEMICONDUCTOR LIMITED, Yokohama, Kanagawa (JP)

(72) Inventor: Michihiro Onoda, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 49 days.

(21) Appl. No.: 13/915,088

(22) Filed: Jun. 11, 2013

(65) Prior Publication Data

US 2014/0021546 A1  Jan. 23, 2014

(30) Foreign Application Priority Data

Jul. 17, 2012 (JP) .................................. 2012-158405

(51) Int. Cl.
*H01L 29/66* (2006.01)
*H01L 29/78* (2006.01)
*H01L 29/06* (2006.01)
*H01L 29/40* (2006.01)
*H01L 27/092* (2006.01)
*H01L 29/08* (2006.01)
*H01L 29/10* (2006.01)
*H01L 21/8238* (2006.01)

(52) U.S. Cl.
CPC ........ *H01L 29/7833* (2013.01); *H01L 29/0611* (2013.01); *H01L 29/402* (2013.01); *H01L 29/66689* (2013.01); *H01L 29/7816* (2013.01); *H01L 29/0653* (2013.01); *H01L 29/0696* (2013.01); *H01L 29/086* (2013.01); *H01L 29/1087* (2013.01); *H01L 21/823814* (2013.01); *H01L 27/0922* (2013.01)

(58) Field of Classification Search
CPC ............ H01L 29/7833; H01L 29/0611; H01L 29/402

See application file for complete search history.

(56) References Cited

U.S. PATENT DOCUMENTS

| | | | | |
|---|---|---|---|---|
| 5,023,678 A | * | 6/1991 | Kinzer | 257/339 |
| 2011/0133269 A1 | | 6/2011 | Yamaji | |
| 2012/0119292 A1 | | 5/2012 | Katayama et al. | |
| 2012/0286829 A1 | * | 11/2012 | Yamji | 327/109 |

FOREIGN PATENT DOCUMENTS

| | | | |
|---|---|---|---|
| EP | PCT/JP2011/061912 | * | 12/2011 |
| JP | 2009-170468 A | | 7/2009 |
| JP | 2011-096967 A | | 5/2011 |
| JP | 2012-104678 A | | 5/2012 |

* cited by examiner

*Primary Examiner* — Fei Fei Yeung Lopez
(74) *Attorney, Agent, or Firm* — Westerman, Hattori, Daniels & Adrian, LLP

(57) ABSTRACT

A semiconductor device includes a semiconductor substrate of a first conductivity type, a first region of a second conductivity type formed in the semiconductor substrate, a second region of the first conductivity type formed in the first region, a source region of the second conductivity type formed in the second region, a drain region of the second conductivity type formed in the first region, a first junction part including a part of a border between the first region and the second region, which is on the side of the drain region, a second junction part including a part of the border between the first region and the second region, which is at a location different from the first junction part, a gate electrode formed above the first junction, and a conductor pattern formed above the second junction part and being electrically independent from the gate electrode.

17 Claims, 36 Drawing Sheets

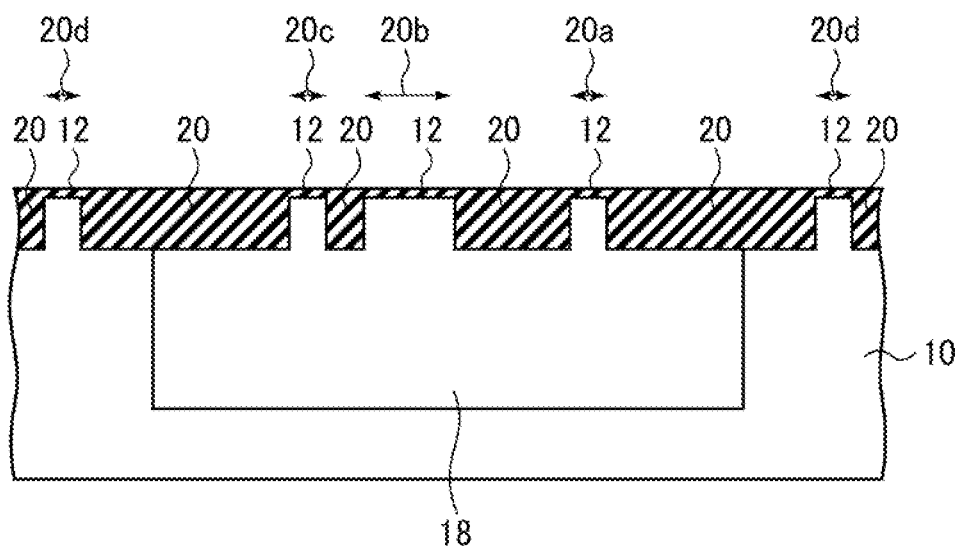
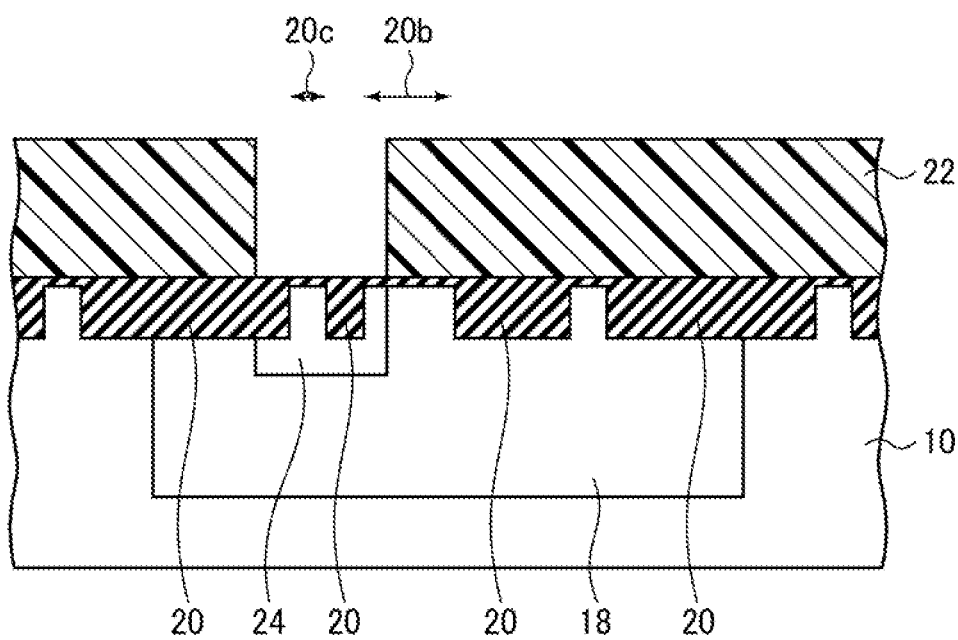

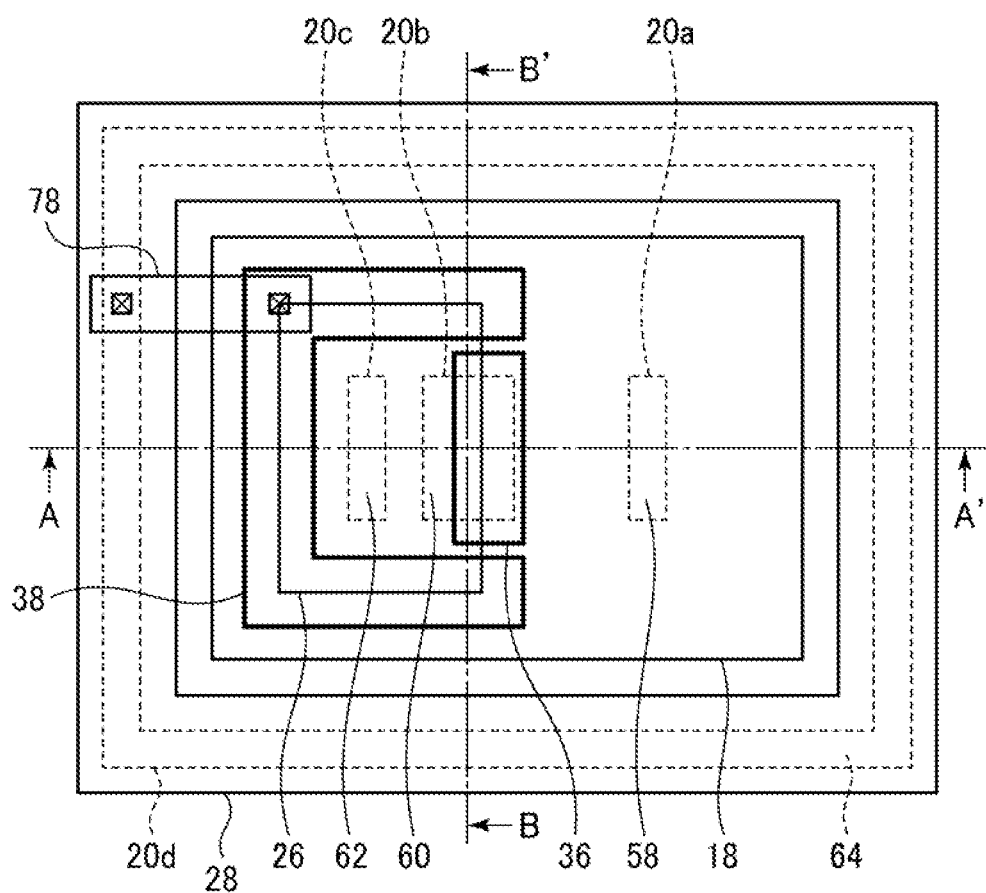

SEMICONDUCTOR DEVICE

CROSS-REFERENCE TO RELATED APPLICATION

This application is based upon and claims the benefit of priority of the prior Japanese Patent Application No. 2012-158405, filed on Jul. 17, 2012, the entire contents of which are incorporated herein by reference.

FIELD

The embodiments discussed herein are related to a semiconductor device.

BACKGROUND

As one of the transistors which are operative at high voltage, the LDMOS (lateral double-diffused metal-oxide-semiconductor) transistor is known. The LDMOS transistor includes a lightly doped diffused layer (drift region) of the same conductivity type as the drain diffused layer laid out between the gate electrode and the drain diffused layer to mitigate the field intensity between the drain and the gate to thereby improve the drain breakdown voltage.

The followings are examples of related: Japanese Laid-open Patent Publication No. 2009-170468; Japanese Laid-open Patent Publication No. 2011-096967; and Japanese Laid-open Patent Publication No. 2012-104678.

However, there are cases that it is difficult to ensure a desired breakdown voltages of the LDMOS transistor, depending on the structures, e.g., the layout relationships between the diffused layers formed in the substrate and the gate electrode, and use modes. Accordingly, the transistor of such structure, and devices including the transistors of such structure has the risk of lowering the performance.

SUMMARY

According to one aspect of the embodiments, there is provided a semiconductor device including a semiconductor substrate of a first conductivity type, a first region of a second conductivity type opposite to the first conductivity type formed in the semiconductor substrate, a second region of the first conductivity type formed in the first region, a source region of the second conductivity type formed in the second region, a drain region of the second conductivity type formed in the first region, a first junction part including a part of a border between the first region and the second region, which is on the side of the drain region, a second junction part including a part of the border between the first region and the second region, which is at a location different from the first junction part, a gate electrode formed above the first junction and a conductor pattern formed above the second junction part and being electrically independent from the gate electrode.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 17A-17B, 18A-18B, 19A-19B, 20A-20B, 21A-21B, 22A-22B, 23A-23B, 24A-24B, 25A-25B, 26A-26B, 27A-27B, 28A-28B, 29A-29B, 30A-30B, 31A-31B and 32A-32B are cross-sectional views illustrating a method of manufacturing the semiconductor device according to the embodiment;

FIG. 33 is a plan view illustrating a structure of a semiconductor device according to a modification of the embodiment.

DESCRIPTION OF EMBODIMENTS

A semiconductor device and a method of manufacturing the semiconductor device according to an embodiment will be described with reference to FIGS. 1 to 36.

First, a structure of the semiconductor device according to the present embodiment will be described with reference to FIGS. 1 to 2B.

Figure 1:
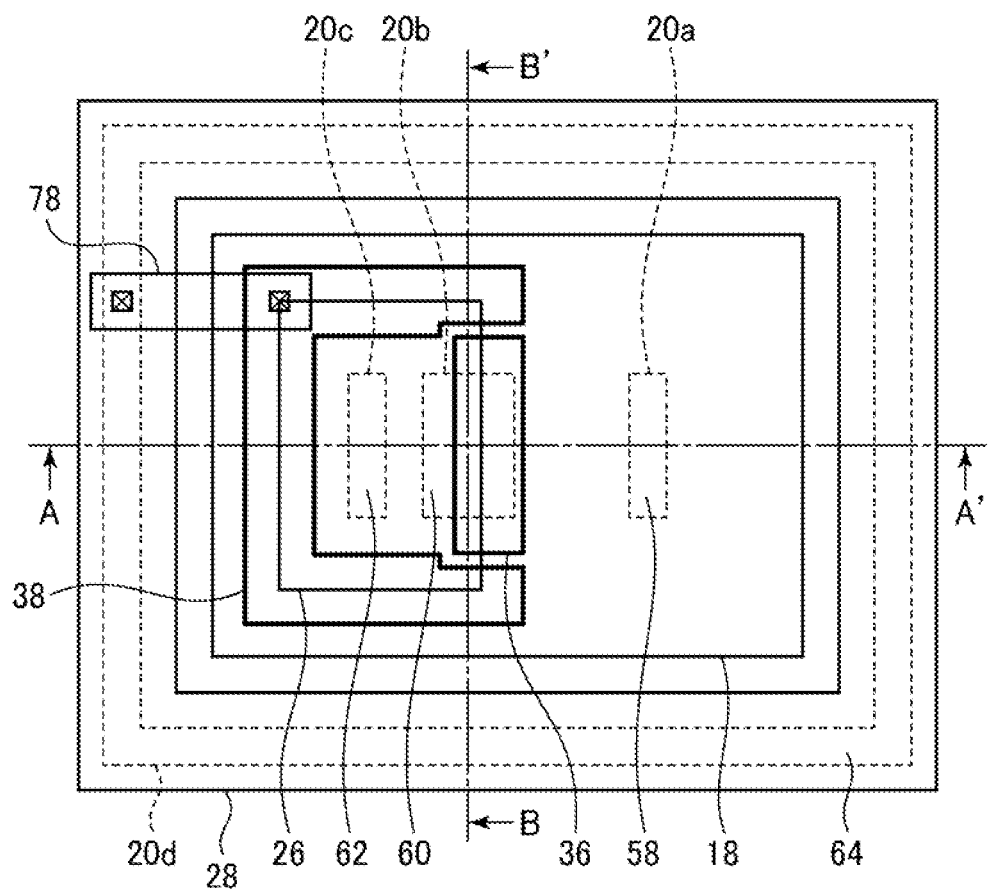
FIGS. 1, 14 and 15 are plan views illustrating a structure of a semiconductor device according to an embodiment.
Figure 2A:
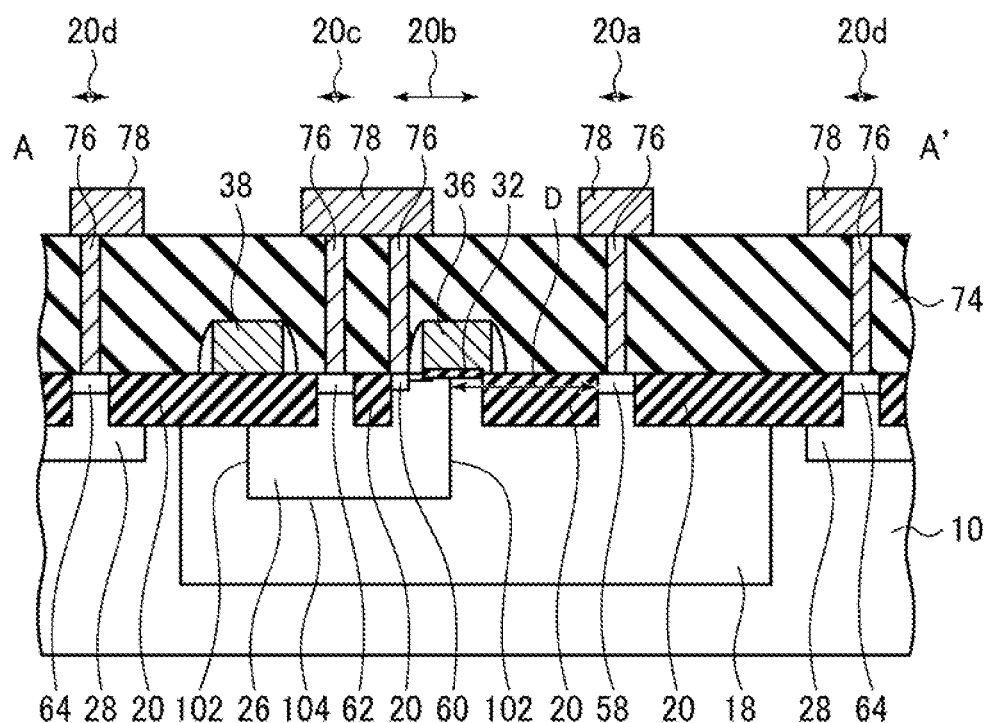
FIGS. 2A and 2B are diagrammatic cross-sectional views illustrating the structure of the semiconductor device according to the embodiment.
Figure 2B:
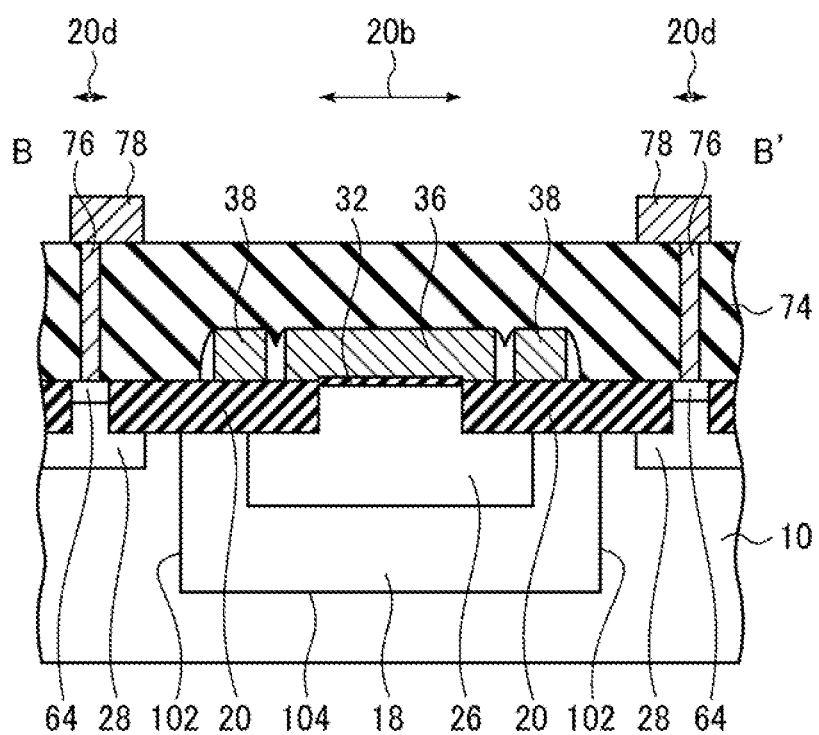

FIG. 1 is a plan views illustrating the structure of the semiconductor device according to the present embodiment. FIGS. 2A and 2B are diagrammatic cross-sectional views illustrating the structure of the semiconductor device according to the present embodiment. FIG. 2A is the A-A' line cross-sectional view of FIG. 1, and the FIG. 2B is the B-B' line cross-sectional view of FIG. 1.

An n-type drift region 18 is formed in a region of a silicon substrate 10 from a surface to a prescribed depth thereof. A p-type body region 26 is formed in a region of the n-type drift region 18 from the surface of the silicon substrate 10 to a depth shallower than the bottom of the n-type drift region 18. The bottom and sides of the p-type body region 26 are enclosed by the n-type drift region 18. A p-n junction 102 is formed between the n-type drift region 18 and the sides of the p-type body region 26. A p-n junction 104 is formed between the n-type drift region 18 and the bottom of the p-type body region 26. In a silicon substrate 10 of a circular region surrounding the n-type drift region 18, a p-well 28 is formed, enclosing and spaced from the n-type drift region 28.

In the surface side of the silicon substrate 10, a device isolation insulating film 20 defining active regions 20a, 20b, 20c, 20d is formed. The active region 20a is formed, exposing a part of the silicon substrate in the region where the n-type drift region 18 is formed. The active region 20b is formed, exposing a part of the region above the p-n junction 102. The active region 20c is formed, exposing a part of the silicon substrate 10 in the region where the p-type body region 26 is formed. The active region 20d is formed, exposing the circular region of the silicon substrate 10 where the p-well 28 is formed. The active region 20b is positioned between the active region 20a and the active region 20c.

A gate electrode 36 is formed above the active region 20b with a gate insulating film 32 interposed therebetween. The gate electrode 36 is formed above the p-n junction 102 positioned in the active region 20b. A part of the n-type body region 26 in the active region 20b is not covered by the gate electrode 36, and in this region of the active region 20b in the surface side, an n-type source region 60 is formed. An n-type drain region 58 is formed in the surface side of the active region 20a. A p-type tap region 62 is formed in the surface side of the active region 20c. A p-type contact region 54 is formed in the surface side of the active region 20d.

A conductor pattern 38 is formed in a region above the p-n junction 102 where the gate electrode 36 is not formed with the device isolation insulating film 20 interposed therebetween. That is, above the p-n junction 201 which is circular as viewed in plane, the gate electrode 36 and the conductor pattern 36 are arranged so as to be circular. The gate electrode 36 and the conductor pattern 38 are electrically isolated from each other.

As described above, the semiconductor device according to the present embodiment is an n-channel LDMOS transistor including the n-type drift region 18, the p-type body region 26, the n-type drain region 58, the n-type source region 60, the p-type tap region 62, the gate electrode 36, the conductor pattern 38, etc.

An inter-layer insulating film 74 is formed above the silicon substrate 10 with the n-channel LDMOS transistor formed. Interconnections 78 connected to the respective terminals of the n-channel LDMOS transistor via contact plugs 76 buried in the inter-layer insulating film 74 are formed above the inter-layer insulating film 74.

As illustrated in FIG. 1, the conductor pattern 38 is electrically connected to the p-well 28 via the interconnection 78, the p-type contact region 64, etc. As illustrated in FIG. 2A, the n-type source region 60 and the p-type tap region 62 are interconnected by the interconnection 78.

In the semiconductor device according to the present embodiment, the p-type tap region 62 and the n-type source region 60, for example, are connected to a power supply voltage Vss on the negative side. Between the gate electrode 36 and the n-type source region 60, a positive voltage Vgs which is relatively low, for example, is applied, and to the n-type drain region 58, a relatively high voltage Vds is applied. The voltage Vgs of above a threshold voltage Vth is applied to the gate electrode 36, whereby electrons flow from the n-type source region 60 to the n-type drain region 58. The n-type drift region 58 which is the propagation path of the electrons is relatively lightly doped, whereby the depletion layer expands in the n-type drift region 18, and a high voltage can be applied to the n-type drain region 58.

The upper limit of the voltage which is applicable to the n-drain region 58 (drain breakdown voltage) is influenced by, e.g., the junction breakdown voltage between the n-type drift region 18 and the p-type body region 26. The value of the junction breakdown voltage is influenced by the width of the depletion layer, and the width of the depletion layer is influenced by the impurity concentration of the n-type drift region 18 and the distance D (drift length) from the p-type body region 26 (p-n junction 102) to the n-type drain region 58. That is, as the n-type drift region 18 is more lightly doped, and the drift length D is made larger, a higher voltage can be applied to the n-type drain region 58. However, when the n-type drift region 18 is such lightly doped, and the drift length D is such made large, the ON-resistance Ron of the transistor increased, and in consideration of, e.g., them, the drift length D and the concentration of the n-type drift region 18 are designed.

In the semiconductor device according to the present embodiment, high voltages are often applied to all of the gate electrode 36, the p-type tap region 62, the n-type source region 60 and the n-type drain region 58. In such case, the punch-through between the p-type body region 26 and the silicon substrate 10 is suppressed by the n-type drift region 18. However, as the n-type drift region 18 is more lightly doped, the punch-through more takes place (punch-through voltage lowers). In consideration, e.g., of this in addition to the drain breakdown voltage, the ON-resistance $R_{on}$, etc., the concentration of the n-type drift region 18 is designed.

The case that the n-type drain region 58 and the n-type source region 60 are provided respectively in the different active regions 20a, 20b, and the device isolation insulating film 20 is provided between the n-type drain region 58 and the n-type source region 60 is exemplified here. This produces the effect that the dielectric breakdown of the gate insulating film 32 at the end of the gate electrode 36 can be suppressed, etc. Depending on operational conditions of the semiconductor device, the drift length D, the concentration of the n-type drift region 18, etc., it is not essential to provide the device isolation insulating film 20 between the n-type drain region 58 and the n-type source region 60. In such case, an active region exposing the n-type drain region 58, the n-type source region 60, and the n-type drift region 18 and the p-type body region 26 between the n-type drain region 58 and the n-type source region 60 is provided. In this active region, the gate electrode 36 is provided along the p-n junction 102 between the n-type drift region 18 and the p-type body region 26, the n-type drain region 58 is provided in the n-type drift region 18, separated from the gate electrode 36, and the n-type source region 60 is provided in the p-type body region 60.

The case that the n-type source region 60 and the p-type tap region 62 are provided respectively in the different active regions 20b, 20c is also exemplified here, but it is not essential to provide the device isolation insulating film 20 between the n-type source region 60 and the p-type tap region 62. The n-type source region 60 and the p-type tap region 62 may be formed in the same active region.

As described above, in the semiconductor device according to the present embodiment, the gate electrode 36 and the conductor pattern 38 are circularly arranged, covering the region above the p-n junction 102 between the n-type drift region 18 and the p-type body region. In the semiconductor device according to the present embodiment, the gate electrode 36 and the conductor pattern 38 are provided in such layout, whereby the high breakdown voltage is achieved. This point will be detailed below.

First, for the comparison, as a semiconductor device which does not include the above-described conductor pattern 38, the semiconductor device of the first reference will be described with reference to FIGS. 3A to 7C.

Figure 3A:
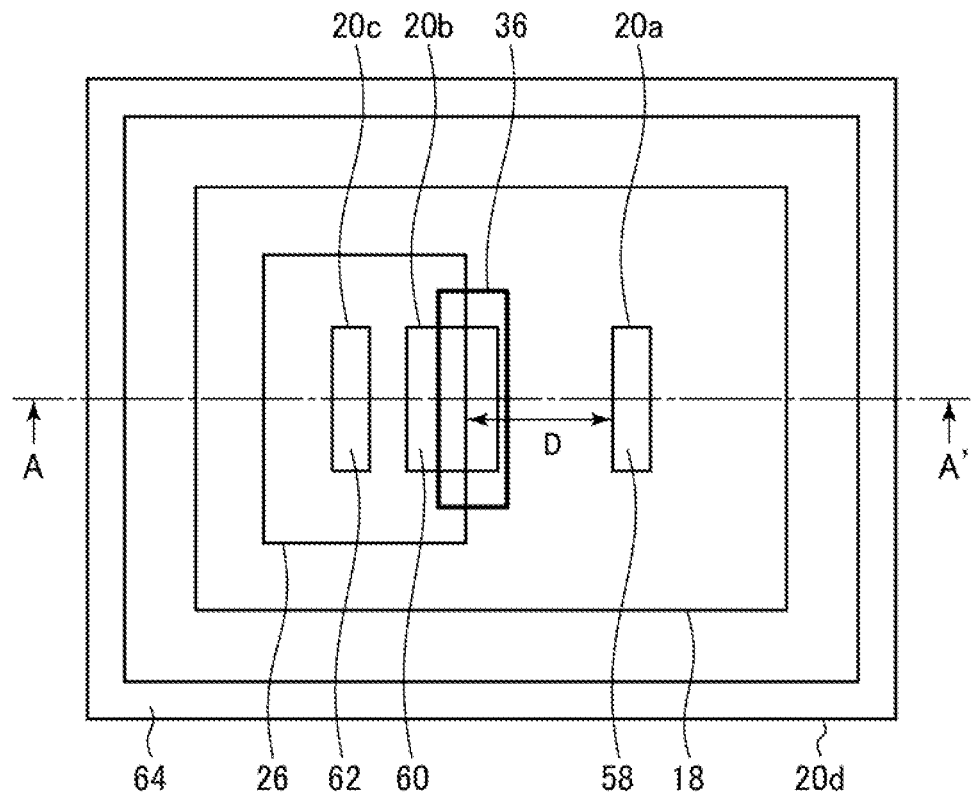
FIGS. 3A and 3B are a plan view and a diagrammatic cross-sectional view illustrating a structure of a semiconductor device of a first reference.
Figure 3B:
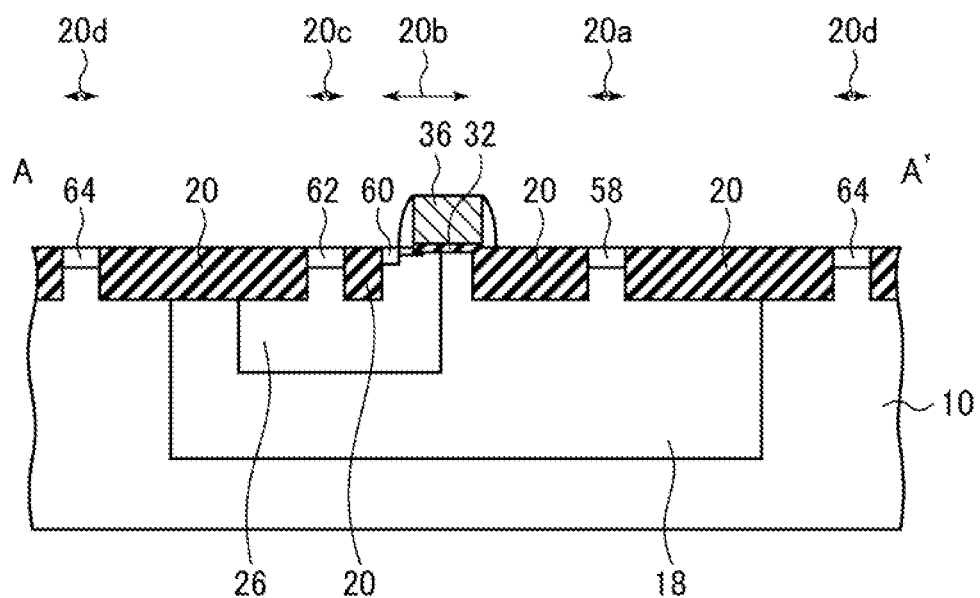
Figure 4:
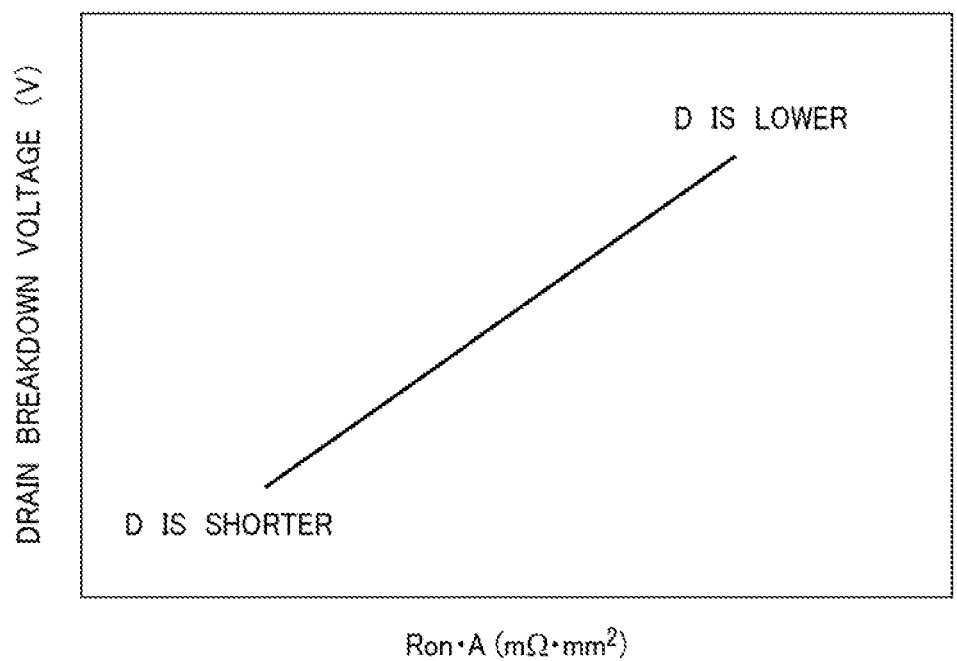
FIG. 4 is a graph illustrating relationships between the drift length, the drain breakdown voltage and $R_{on} \cdot A$.
Figure 5:
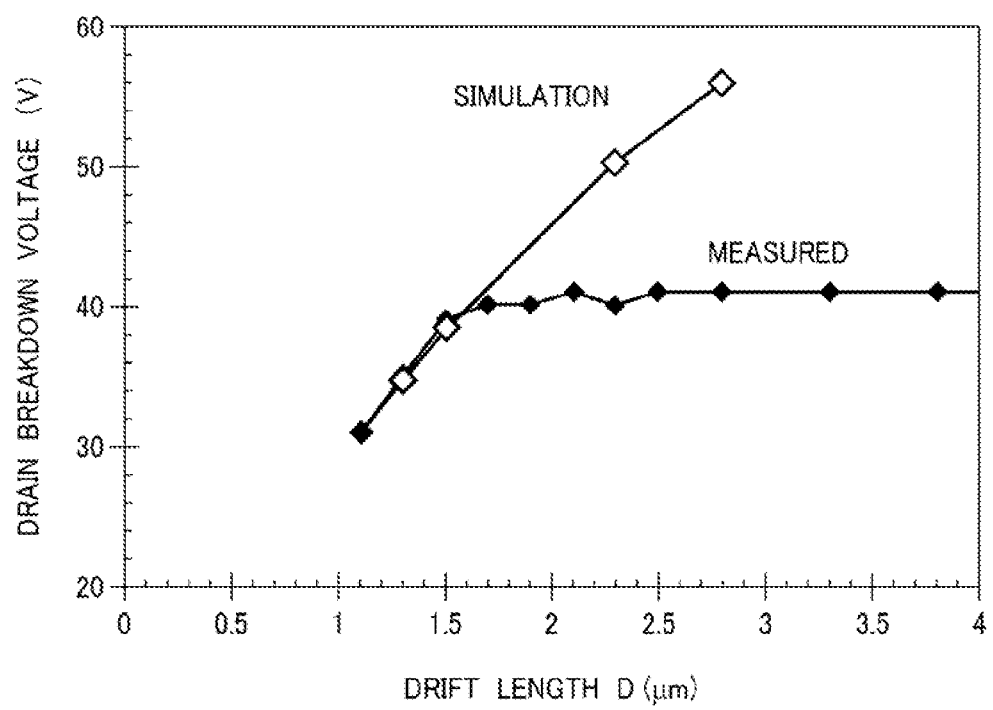
FIG. 5 is a graph illustrating the result of simulating the drift length dependency of the drain breakdown voltage, and the actually measured result.
Figure 6:
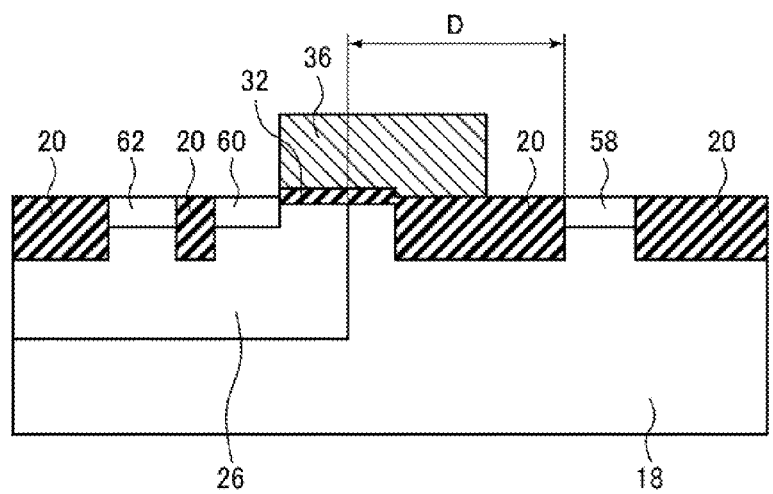
FIG. 6 is a two-dimensional cross-sectional structure used in the simulation.
Figure 7A:
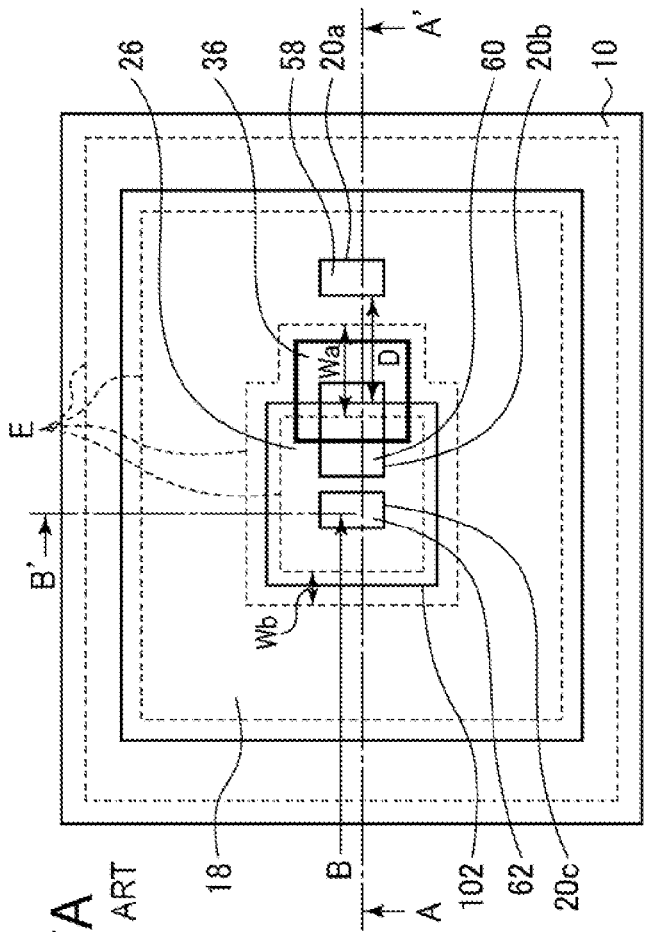
FIGS. 7A, 7B and 7C are a plan view and cross-sectional views explaining the expansion of the depletion layer in the semiconductor device of the first reference at breakdown.
Figure 7B:
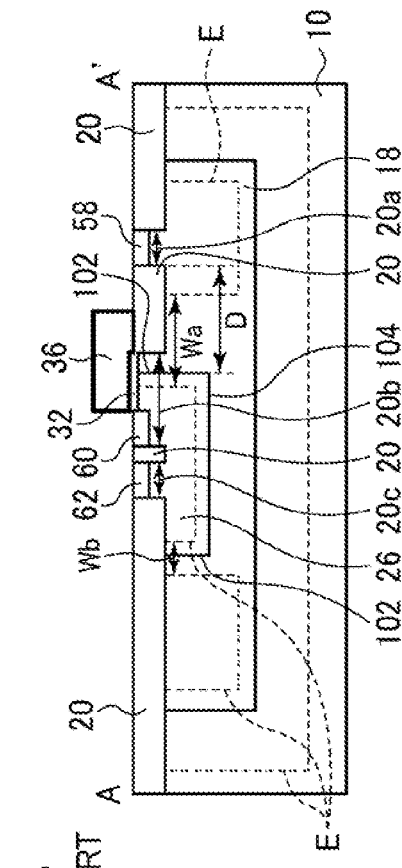
Figure 7C:
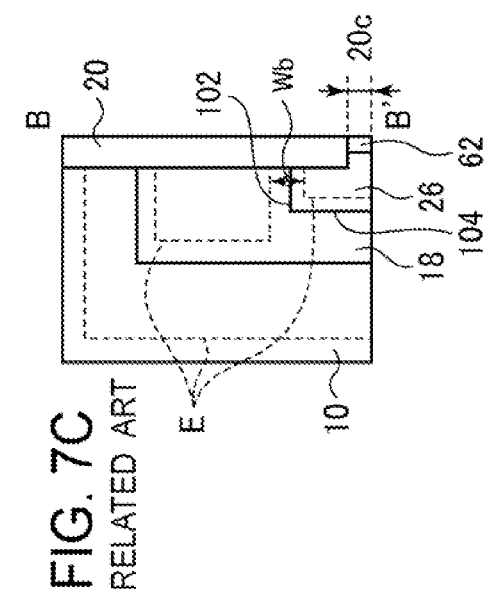

FIGS. 3A and 3B are a plan view and a diagrammatic cross-sectional view illustrating a structure of the semiconductor device of the first reference. FIG. 4 is a graph illustrating relationships between the drift length, the drain breakdown voltage and $R_{on} \cdot A$. FIG. 5 is a graph illustrating the result of simulating the drift length dependency of the drain breakdown voltage, and the actually measured result. FIG. 6 is a two-dimensional cross-sectional structure used in the simulation. FIGS. 7A, 7B and 7C are a plan view and cross-sectional views explaining the expansion of the depletion layer in the semiconductor device of the first reference at breakdown.

FIGS. 3A and 3B are views illustrating the structure of the semiconductor device of the first reference. FIG. 3A is a plan view, and FIG. 3B is the A-A' line cross-sectional view of FIG. 3A.

As illustrated in FIGS. 3A and 3B, the semiconductor device of the first reference is different from the semiconductor device 10 according to the present embodiment illustrated in FIGS. 1 and 2 in that the former does not include the conductor pattern 38.

The factor deciding the characteristics of a high voltage resistant transistor is, in addition to the drain breakdown voltage described above, the value expressed by the product between the ON-resistance and the occupied area A ($R_{on} \cdot A$), of the transistor. The ON-resistance $R_{on}$ is a value given by applying a voltage as small as about 0.1 V to the drain and dividing the drain voltage by a current flowing in the drain when the gate is turned on. As the $R_{on} \cdot A$ is smaller, the characteristics of the transistor are better. The $R_{on} \cdot A$ varies in accordance with, e.g., the drift length D, and as the drift length D is larger, the ON-resistance $R_{on}$ becomes larger, and the occupied area A becomes larger. That is, The drift length D, the drain breakdown voltage and the $R_{on} \cdot A$ can have the relationship illustrated in FIG. 4. In the relationship illustrated in FIG. 4, when the drift length D is made larger to thereby increase the drain breakdown voltage, the $R_{on} \cdot A$ increases, and when the drift length D is made smaller to decrease the $R_{on} \cdot A$, the drain breakdown voltage decreases. In designing the circuit of the high voltage resistant transistor, such relationships, for example, are considered to decide desired characteristics.

According to the relationship of FIG. 4, in the semiconductor device illustrated in FIG. 3, as well, as the drift length D is increased, the drain breakdown voltage is expected to increase. However, in the actual structure of the semiconductor device illustrated in FIG. 3, when the drift length D is above a prescribed length, often the drain breakdown voltage does not increase corresponding to the drift length D.

FIG. 5 illustrates the results of the simulated and the actually measured drift length dependency of the drain breakdown voltage. The simulation was made on the two-dimensional structure of FIG. 6 by the so-called TCAD (Technology Computer Aided Design). The actual measurement was made on the semiconductor device illustrated in FIG. 3 by actually fabricating the same.

As illustrated in FIG. 5, the simulation on the two-dimensional structure of FIG. 6 illustrates that the drift length D is made longer, the drain breakdown voltage increases. On the other hand, in the actual measurement using the actually formed semiconductor device, the drain breakdown voltage increases corresponding to a drift length D up to about 1.5 µm, but when the drift length D is larger than about 1.5 µm, the drain breakdown voltage is about 40 V and substantially constant. Thus, in the actually formed semiconductor device, even when the drift length D is larger than a prescribed value, a higher drain breakdown voltage than about 40 V cannot be obtained. For this, the following reason is considered.

FIGS. 7A-7C are views explaining the expansion of the depletion layer upon a breakdown in the semiconductor device of the first reference. FIG. 7A is a plan view, FIG. 7B is the A-A' line cross-sectional views of FIG. 7A, and FIG. 7C is the B-B' line cross-sectional view of FIG. 7A. In FIG. 7, the edge E of the depletion layer is indicated schematically by the dotted line.

The case that the drift length D is 3.0 µm, the applied voltages to the gate electrode 36, the n-type source region 60, the p-type tap region 62 and the silicon substrate 10 is 0 V, and the applied voltage to the n-type drain region 58 is the value of the drain breakdown voltage is assumed here. As illustrated in FIG. 5, the drift length D of 3 µm corresponds to the breakdown voltage of not less than 55V in the simulation, but corresponds to only 40V in the actual measurement.

In the part where the gate electrode 36 is laid out, as illustrated in FIGS. 7A and 7B, the depletion layer of a width (depletion layer width) Wa is expanded along the gate electrode 36. This is because 0 V is applied to the gate electrode 36. On the other hand, the part where the gate electrode 36 is not laid out, as illustrated in FIG. 7C, the depletion layer of a width (depletion layer width) Wb which is decided by the concentrations of the n-type drift region 18 and the p-type body region 26 is expanded. In the case of FIGS. 7A-7C, the depletion layer width Wa is larger than the depletion layer width Wb.

The breakdown tends to take place at a part where the depletion layer is narrow. This is because the electric field more intensifies at the part where the depletion layer is narrower. Accordingly, in the semiconductor device of the first reference, the breakdown tends to take place at the part where the depletion layer width Wb is smaller. At the part of the depletion layer width Wb, the breakdown voltage does not depend on the drift length D and is decided by the concentrations of the n-type drift region 18 and the p-type body region 26, as is not at the part of the depletion layer width Wa. The breakdown voltage of the part of the depletion layer width Wb is about 40 V, whereby it is considered that under the conditions of the actual measurement, as illustrated in FIG. 5, even with the drift length D set longer than a prescribed value, the breakdown voltage of the transistor becomes constant at about 40 V and does not rise any more.

The depletion layer edges E at the part of the depletion layer width Wa on the side of the n-type drift region 18 is prevented by the n-type drain region 58 from expanding, which often shortens the drift length D and makes the depletion layer width Wa narrower than the depletion layer width Wb. In this case, the drain breakdown voltage depends on the drift length D. This corresponds to the tendency seen in the actually measured data illustrated in FIG. 5 when the drift length D is smaller than 1.5 µm, and the drain breakdown voltage is increased as the drift length D increased.

In the simulation of FIG. 5, the drain breakdown voltage depends on the drift length D because the simulation was made on the two-dimensional structure of FIG. 6. That is, the part of the depletion layer width Wb, which is except the transistor part illustrated in FIGS. 7A-7C, i.e., the p-n junction 102 between the n-type drift region 18 and the p-type body region 26 in the region where the gate electrode 36 is not laid out was not included in the structure the simulation was made on.

Next, further for the comparison, as a semiconductor device including the circular gate electrode provided along the p-n junction 102 between the n-type drift region 18 and the p-type body region 26, the semiconductor device of the second reference will be described with reference to FIGS. 8A to 12.

Figure 8A:
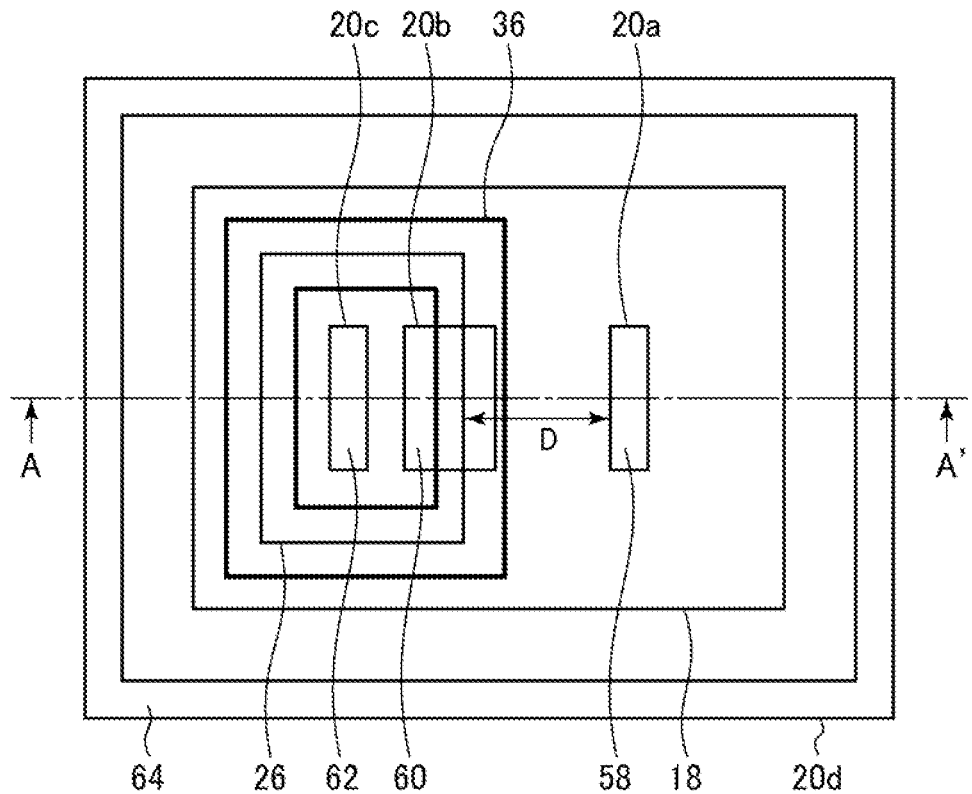
FIGS. 8A and 8B are a plan view and a diagrammatic cross-sectional view illustrating a structure of a semiconductor device of a second reference.
Figure 8B:
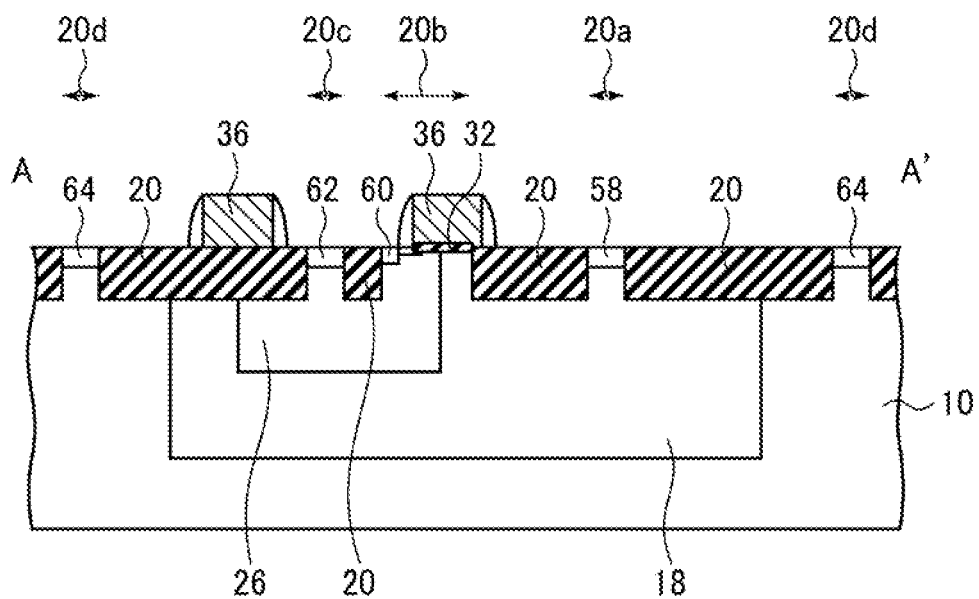
Figure 11:
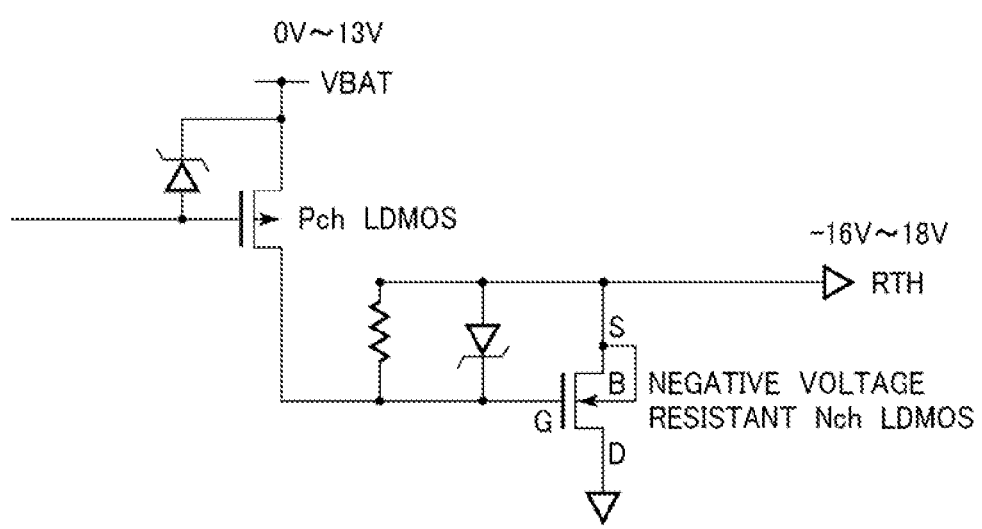
FIG. 11 is a view exemplifying a circuit using a negative voltage resistant n-channel LDMOS transistor.
Figure 12:
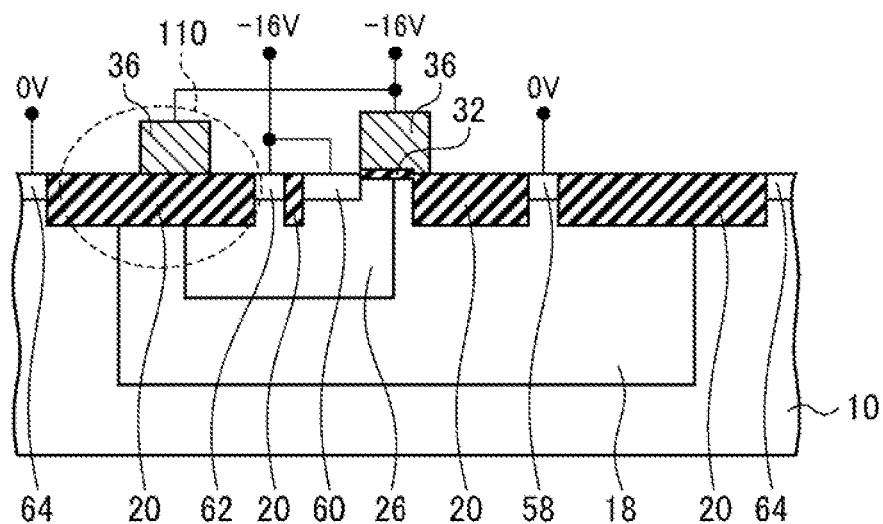
FIG. 12 is a view explaining a problem of the semiconductor device of the second reference.

FIGS. 8A and 8B are a plan view and a diagrammatic cross-sectional view illustrating a structure of the semiconductor device of the second reference. FIGS. 9A-9C and 10A-10C are a plan view and cross-sectional views explaining the expansion of the depletion layer in the semiconductor device of the second reference at breakdown. FIG. 11 is a view exemplifying a circuit using a negative voltage resistant n-channel LDMOS transistor. FIG. 12 is a view explaining a problem of the semiconductor device of the second reference.

FIGS. 8A and 8B are views illustrating the structure of the semiconductor device of the second reference. FIG. 8A is a plan view, and FIG. 8B is the A-A' line cross-sectional view of FIG. 8A.

As illustrated in FIGS. 8A and 8B, the semiconductor device of the second reference is different from the semiconductor device according to the present embodiment illustrated in FIGS. 1 and 2 in that in the former, the gate electrode 36 is circularly arranged along the p-n junction 102.

Figure 9A:
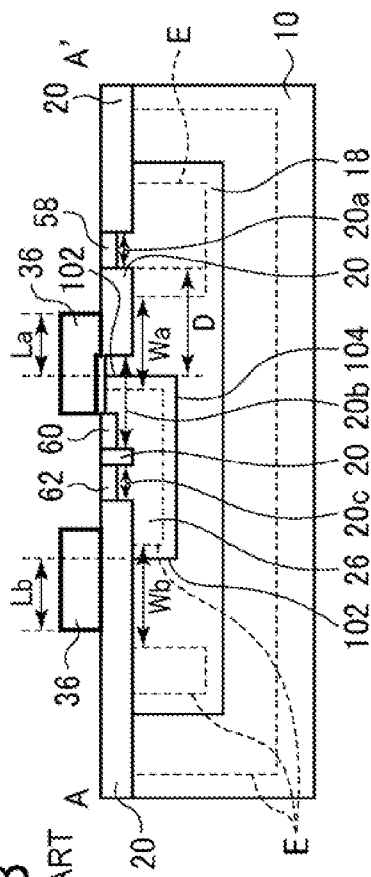
FIGS. 9A, 9B and 9C are a plan view and cross-sectional views explaining the expansion of the depletion layer in the semiconductor device of the second reference at breakdown (Part 1)
Figure 9B:
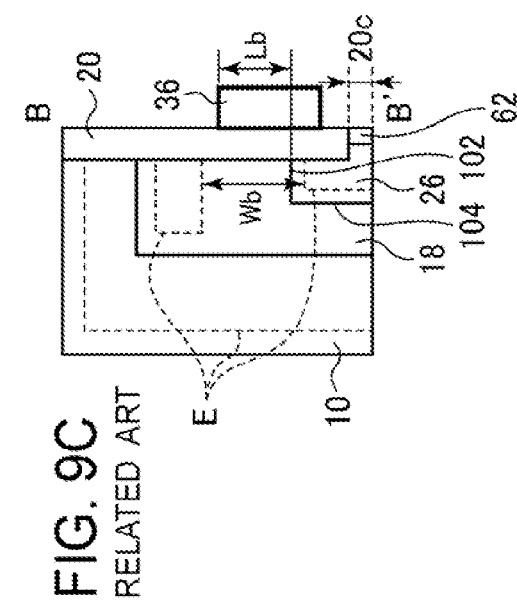
Figure 9C:
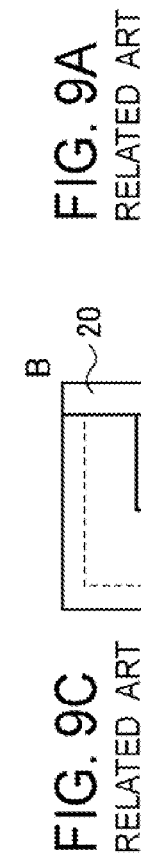

FIGS. 9A-9C are views explaining the expansion of the depletion layer upon a breakdown of the semiconductor device of the second reference. FIG. 9A is a plan view, FIG. 9B is the A-A' line cross-sectional view of FIG. 9A, and FIG. 9C is the B-B' line cross-sectional view of FIG. 9A. In FIG. 9, the edge E of the depletion layer is schematically indicated by the dotted line.

The case that the applied voltages to the gate electrode 36, the n-type source region 60, the p-type tap region 62 and the silicon substrate 10 is 0 V, and the applied voltage to the n-type drain region 58 is the value of the drain breakdown voltage is assumed here.

The circular gate electrode 36 is provided along the p-n junction 102, whereby the depletion layer width Wb generated in the part where the n-type drain region 58 and the n-type source region 60 are not opposed to each other becomes wider than that of the semiconductor device of the first reference, in which the island-shaped gate electrode 36 is provided. That is, in the semiconductor device of the second reference, in the part except the transistor part, the depletion layer of a width Wb equal to a width Wa of the depletion layer generated in the transistor part. This is because the circular gate electrode 36 with 0 V applied to is laid out also in such part except the transistor part, and its electric field expand the depletion layer of a width larger than a width decided by the concentrations of the n-type drift region 18 and the p-type body region 26.

Thus, in the semiconductor device of the second reference, the circular gate electrode 36 is provided, whereby the depletion layer around the p-n junction 102 is expanded, preventing the depletion layer from partially narrowing, and breakdowns can be prevented around the p-n junction 102. Accordingly, the drain breakdown voltage can be improved in comparison with the structure of the first reference described above.

The width of the gate electrode 36 of the semiconductor device of the second reference will be further described here.

As illustrated in FIGS. 9A-9C, the width from the p-type body region 26 to the outer periphery of the gate electrode 36 at a part where the gate electrode 36 is sandwiched by the n-type drain region 58 and the n-type source region 60 is defined as La. The width from the p-type body region 26 to the outer periphery of the gate electrode 36 at the other part is defined as Lb.

FIGS. 9A-9C exemplifies the case that the gate electrode 36 is provided to be La=Lb. In the case that the gate electrode 36 is provided to be La=Lb, the depletion layer width Wa of the transistor part where the n-type drain region 58 and the n-type source region 60 are opposed to each other and the depletion layer width Wb of the part except the transistor part can be made equal to each other. Accordingly, the depletion layer width can be prevented from narrowing partially around the p-n junction 102, and the breakdown can be suppressed.

Figure 10A:
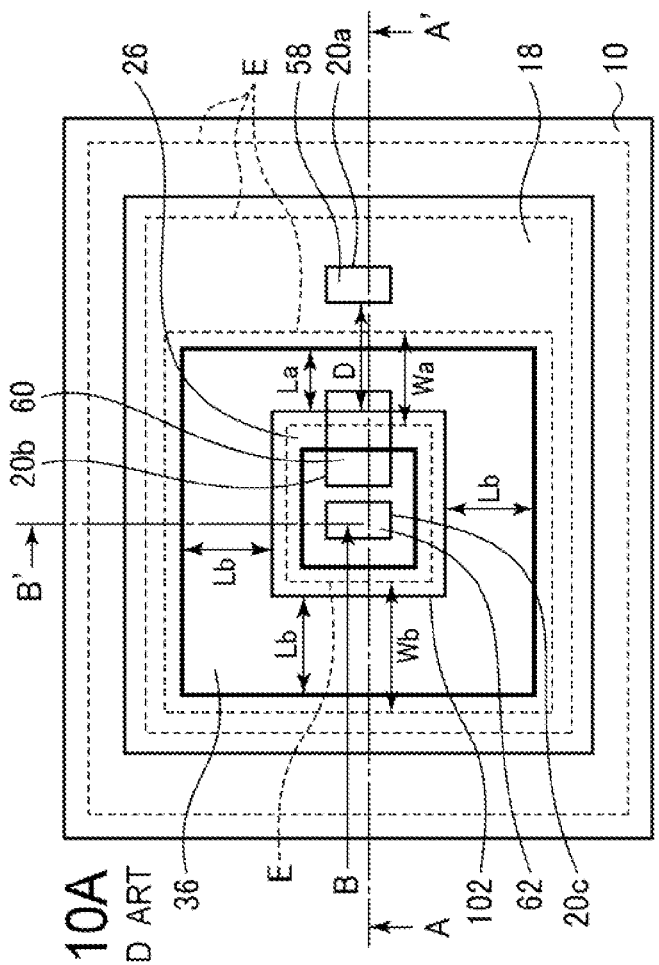
FIGS. 10A, 10B and 10C are a plan view and cross-sectional views explaining the expansion of the depletion layer in the semiconductor device of the second reference at breakdown (Part 2)
Figure 10B:
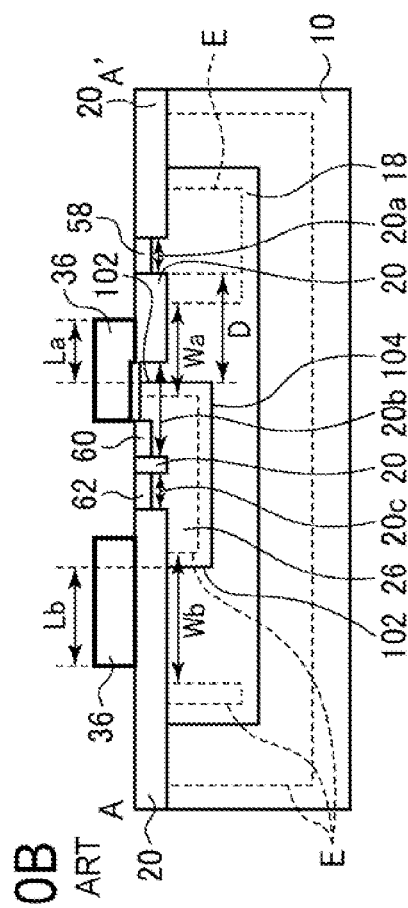
Figure 10C:
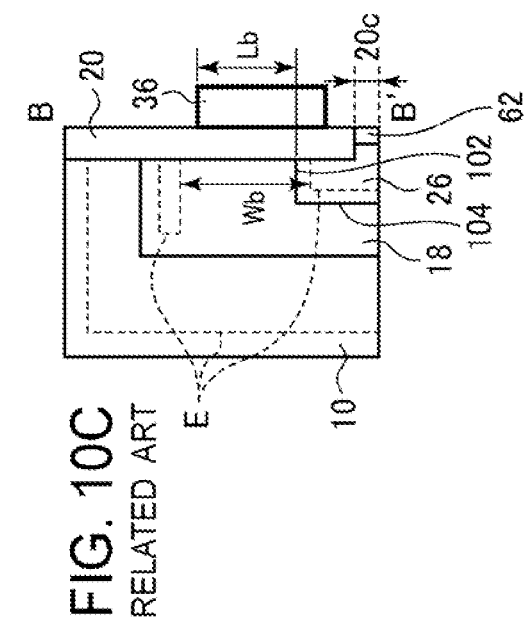

As illustrated in FIGS. 10A-10C, the gate electrode 36 can be provided to be La<Lb.

FIGS. 10A-10C illustrates another example of the semiconductor device of the second reference. FIG. 10A is a plan view, FIG. 10B is the A-A' line cross-sectional view of FIG. 10A, and FIG. 10C is the B-B' line cross-sectional view of FIG. 10A.

FIG. 10 also illustrates the expansion of the depletion layer upon a breakdown. The case that the applied voltages to the gate electrode 36, the n-type source region 60, the p-type tap region 62 and the silicon substrate 10 are 0 V, and the applied voltage to the n-type drain region 58 is the value of the drain breakdown voltage is assumed here. In FIGS. 10A-10C, the edge E of the depletion layer is schematically indicated by the dotted line. In FIG. 10A, the device isolation region 20 is omitted for the convenience of the description, and the p-n junction 102 below the gate electrode 36 and the gate insulating film 32 is illustrated by the solid line.

As in the semiconductor device of FIGS. 10A-10C, the circular gate electrode 36 may be designed to be La<Lb. In this case, the depletion layer width Wa of the part between the n-type drain region 58 and the n-type source region 60, i.e., the transistor part becomes narrower than the depletion layer width Wb of the other part. Accordingly, around the p-n junction 102, the transistor part tends to breakdown at a voltage lower than that of the other part. That is, the gate electrode 36 is design to be La<Lb, whereby the drain breakdown voltage of the transistor varies depending on the drift length D, which allows to estimate the drain breakdown voltage, based on the drift length D in the circuit design.

The cases that the gate electrode 36 is provided to be La=Lb and La<Lb have been described here, but the gate electrode 36 can be provided to be La>Lb. Even with the gate electrode 36 provided to be La>Lb, the depletion layer width Wb of the part except the transistor part can be made wider in comparison with the case that the gate electrode 36 is not circular, and the breakdown can be suppressed.

In the general modes of using the n-channel LDMOS transistor, to the p-type body region 26, a voltage which is more negative than to the silicon substrate 10 is not applied, but the n-channel LDMOS transistor may be used in a circuit structure of such voltage relationship. For example, in the circuit of FIG. 11, a voltage of 0 V is applied to the drain D of the n-channel LDMOS transistor, and to the source S and the back gate B of the n-channel LDMOS transistor, a voltage of −16 V~+18 V is applied. The n-channel LDMOS transistor used in such circuit is often called the negative voltage resistant re-channel LMOS transistor.

When the operation as the negative voltage resistant n-channel LDMOS transistor in the semiconductor device of the second reference is assumed, the voltages exemplified in FIG. 12 are applied to the respective terminals of the transistor. That is, to the gate electrode 36, the n-type source region 60 and the p-type tap region 62, −16 V, for example, is applied, and 0 V, for example, is applied to the n-type drain region 58 and the silicon substrate 10 (p-type contact region 64).

At this time, in the part enclosed by the dotted line in FIG. 12, a p-type parasitic transistor 110 having the silicon substrate 10 as the source region, the p-type body region 26 as the drain region, the n-type drift region 18 as the back gate and the gate electrode 36 as the gate electrode is formed. When the drive voltages described above are applied, −16 V is applied to the gate electrode and the drain region of the p-type parasitic transistor 110, and to the source region and the back gate, 0 V is applied. The field threshold voltage of the p-type parasitic transistor 110 is about −7 V, and the application of the drive voltage turns on the p-type parasitic transistor 110, and a current flows between the silicon substrate 10 and the p-type body region 26. Consequently, the breakdown voltage between the silicon substrate 10 and the p-type body region 26 lowers, and resultantly the breakdown takes place at an applied voltage lower than the drain breakdown voltage estimated, based on the drift length D.

From such viewpoint, in the semiconductor device according to the present embodiment, the circular gate electrode of the semiconductor device of the second reference is divided in the part extended above the active region 20b where the gate electrode intrinsically acts and the part extended above the device isolation insulating film 20. That is, a circular gate electrode is divided in the gate electrode 36 formed in the part extended on the active region 20b and the conductor pattern 38 formed in the part extended on the device isolation insulating film 20. The conductor pattern 38 extended above the device isolation insulating film 20 is electrically connected to the silicon substrate 10, whereby the p-type parasitic transistor 110 is not turned on when the transistor is driven as the negative voltage resistant n-channel LDMOS transistor.

Figure 13:
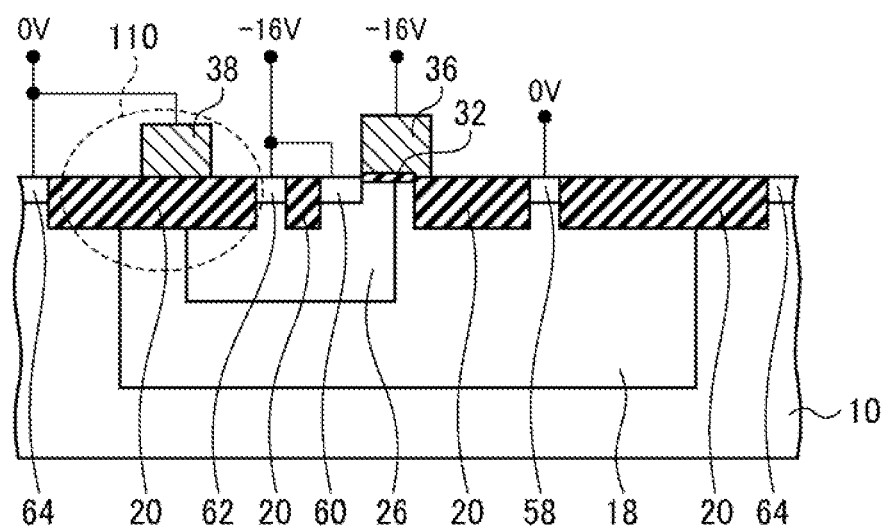
FIG. 13 is a view explaining an advantageous effect of the semiconductor device according to the embodiment.

When the operation of the semiconductor device according to the present embodiment as the negative voltage resistant LDMOS transistor is assumed, the voltages exemplified in FIG. 13 are applied to the respective terminals of the transistor. That is, −16 V, for example, is applied to the gate electrode 36, the n-type source region 60 and the p-type tap region 62, and 0 V, for example, is applied to the conductor pattern 38, the n-type drain region 58 and the silicon substrate 10 (p-type contact region 64).

At this time, the p-type parasitic transistor 110 enclosed by the dotted line in FIG. 13 is not turned on because the applied voltage to the conductor pattern 38 which corresponds to the gate electrode is 0 V, and no current flows between the silicon substrate 10 and the p-type body region 36. Consequently, the breakdown voltage between the silicon substrate 10 and the p-type body region 26 does not lower, and the breakdown can be prevented with an applied voltage lower than the drain breakdown voltage estimated, based on the drift length D.

When the semiconductor device according to the present embodiment is operated not as the negative voltage resistant LDMOS transistor but as the ordinary re-channel LDMOS transistor, the operation is the same as the above-described operation of the semiconductor device of the second reference. That is, the effect of the semiconductor device of the second reference explained with reference to FIGS. 9A and 10C is produced also by the semiconductor device according to the present embodiment. That is, the conductor pattern 38 of the semiconductor device according to the present embodiment acts in the same way as the part of the gate electrode 36 of the semiconductor device of the second reference, which is extended above the device isolation insulating film 20. Because of the conductor pattern 38, the depletion layer width Wb of the part except the transistor part can be increased, whereby the breakdown can be prevented with an applied voltage lower than the drain breakdown voltage estimated, based on the drift length D. The relationship of La<Lb can be realized, e.g., by making the width of the conductor pattern 38 larger than the width of the gate electrode 36.

Figure 14:
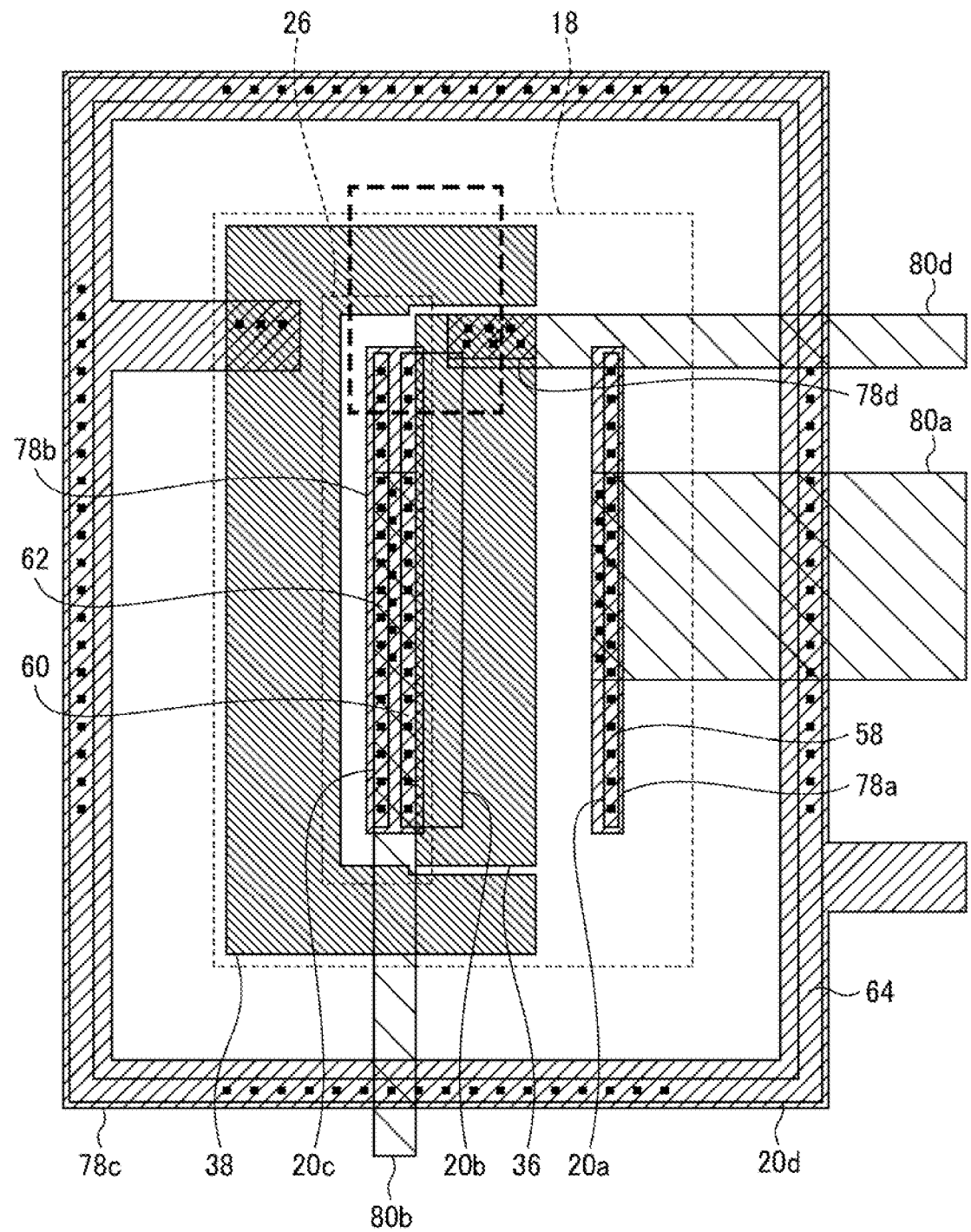
Figure 15:
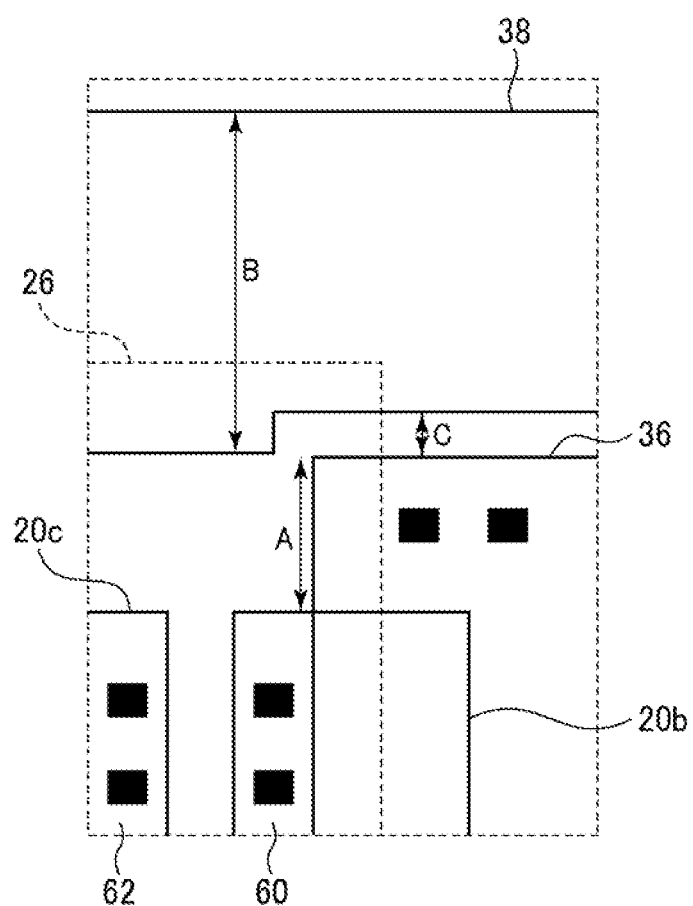

FIGS. 14 and 15 are plan views of an example of the specific layout of the semiconductor device according to the present embodiment. FIG. 15 is an enlarged view of the part enclosed by the dotted line in FIG. 14. In the drawings, the ■ marks indicate the contact regions.

As illustrated in FIG. 14, the n-type drain region 58 is led out via the first level interconnection 78a and connected to the second level interconnection 80a. The n-type source region 60 and the p-type tap region 62 are lead out and connected to each other by the first level interconnection 78b and connected to the second level interconnection 80b. The p-type contact region 64 is connected to the first level interconnection 78c. The interconnection 78c is circularly provided along the p-type contact region 64. The gate electrode 36 is led out via the first level interconnection 78d and connected to the second level interconnection 80d. The conductor pattern 38 is connected to the interconnection 78c.

The part between the gate electrode 36 and the conductor pattern 38 can be laid out as exemplified in FIG. 15. In the drawing, "A" indicates an overlap length of the gate electrode 36 over the device isolation insulating film 20, and is decided, based on the design rule and is, e.g., about 1.6 μm. In the drawing, "C" indicates an interval between the gate electrode 36 and the conductor pattern 38, and is decided, based on design rule and is about 0.26 μm. In the drawing, "B" is decided, based on the drain breakdown voltage and preferably is longer for the improvement of the drain breakdown voltage. In order that "C" satisfies the design rule, and besides the length of "B" is made longer to thereby improve the drain breakdown voltage, it is preferable, as illustrated in FIG. 15, to form the steps in the sides of the conductor pattern 38 opposed to the gate electrode 36 to thereby make larger the width of the parts of the conductor pattern 38 spaced from the gate electrode 36. The width of the parts of the conductor pattern 38 spaced from the gate electrode 36 is, e.g., about 6.2 μm.

The distance between the n-type drain region 58 and the p-n junction 102 is longer than the distance between the n-type source region 60 and the p-n junction 102.

It is not essential to form the recesses as illustrated in FIG. 15 in the parts of the conductor pattern 38 adjacent to the gate electrode 36 and, as exemplified in FIG. 33, may be straight from the parts spaced from the gate electrode 36.

However, providing the recesses in the parts of the conductor pattern 38 adjacent to the gate electrode 36 produces the following effect.

Figure 34:
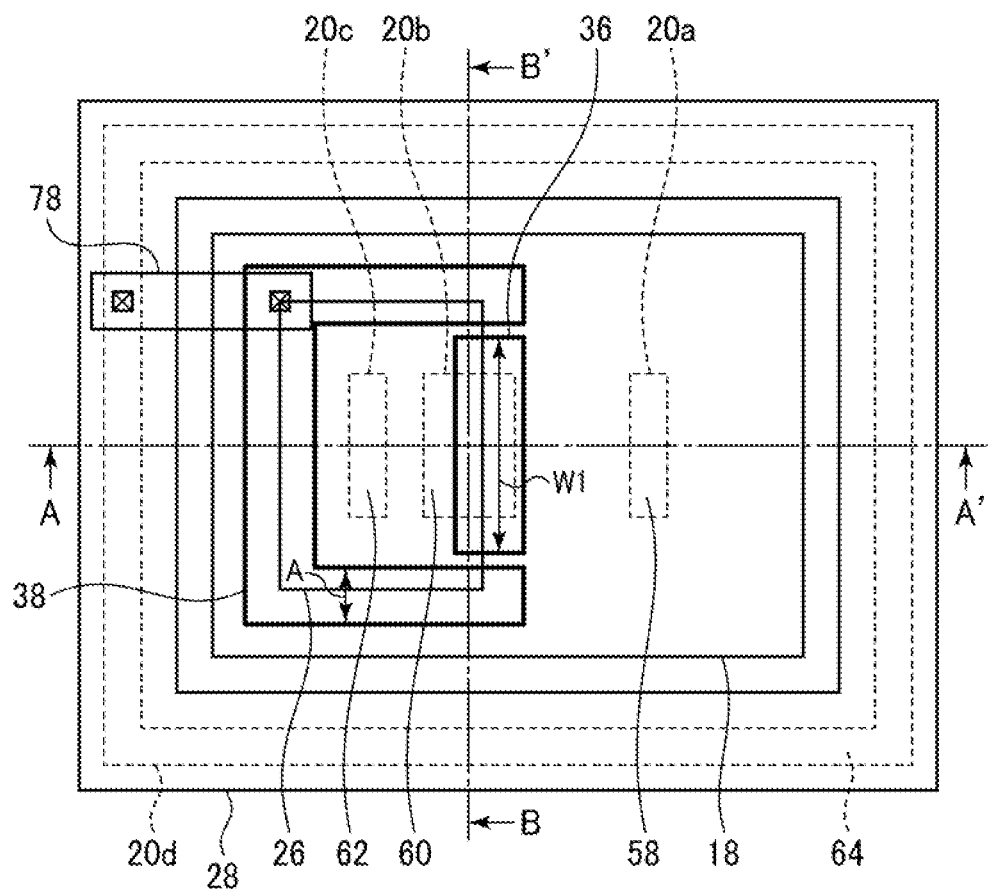
FIGS. 34, 35 and 36 are plan views explaining advantageous effects of the layout of FIG. 15.
Figure 35:
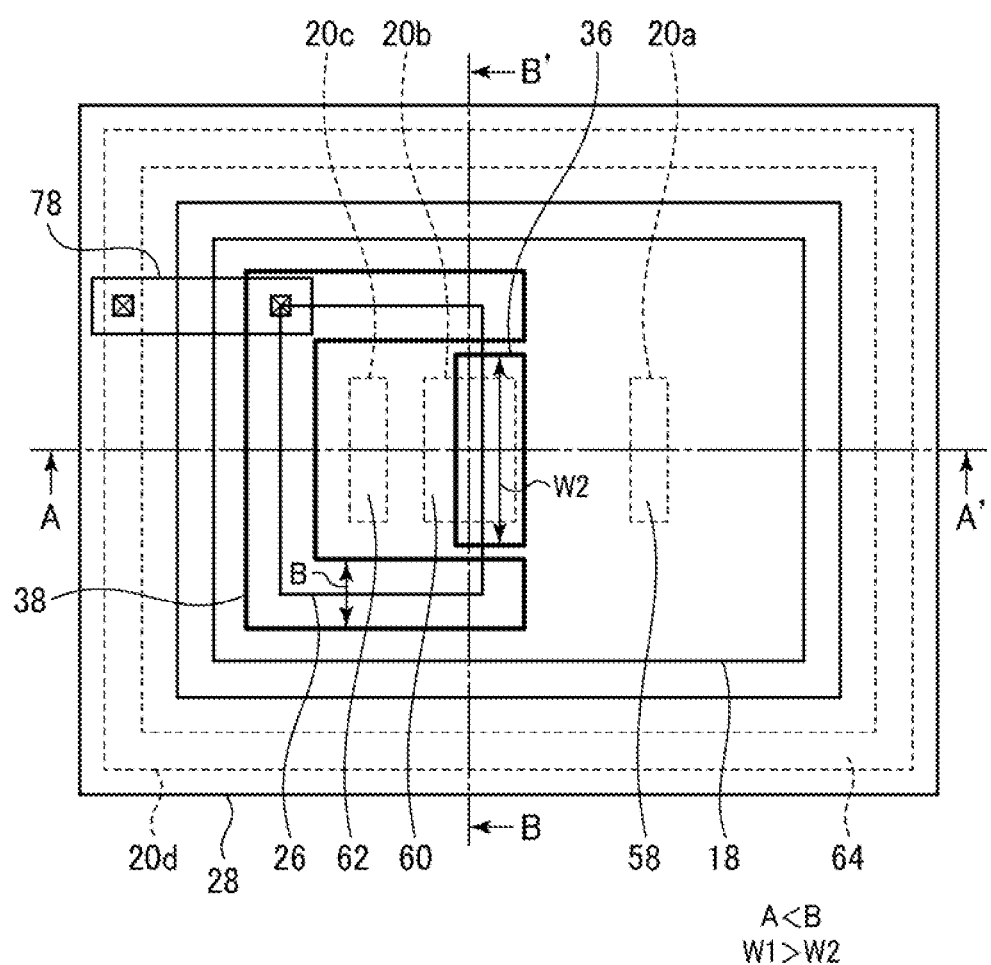
Figure 36:
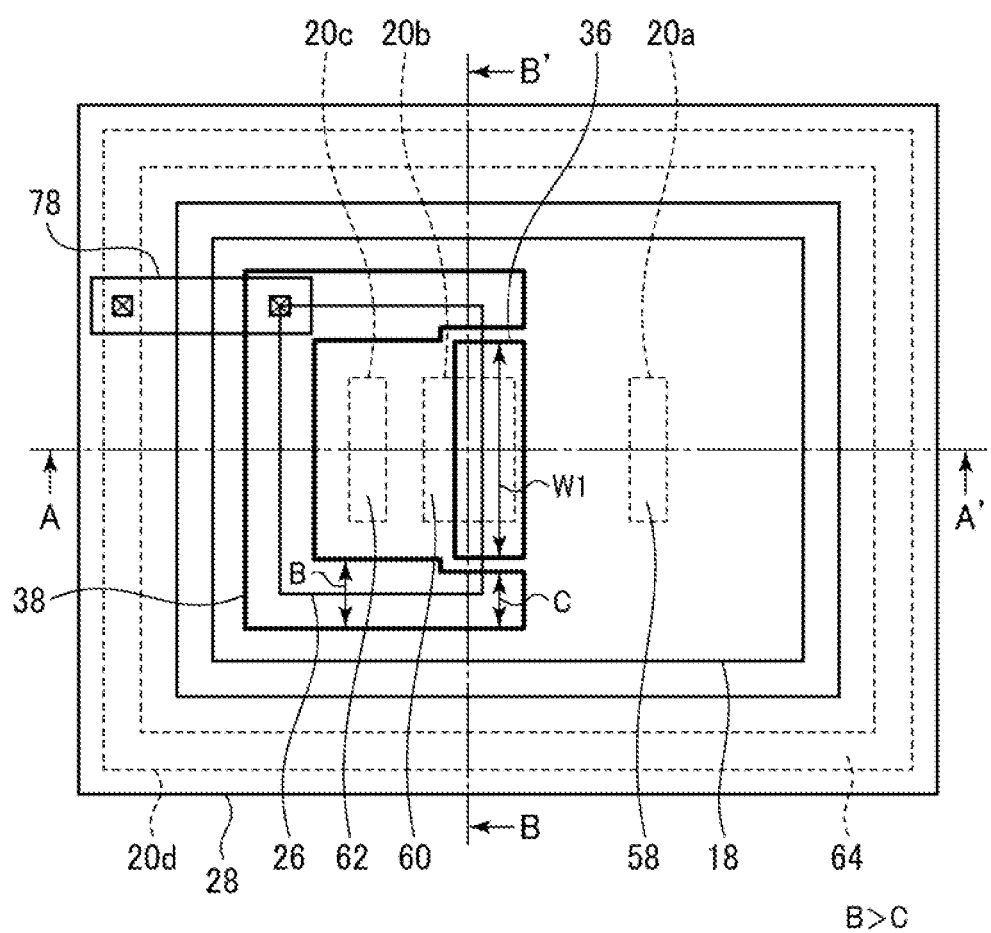

In the layout of FIG. 33, the width of the gate electrode 36 is W1, and the width of the conductor pattern 38 is A (see FIG. 34). It is considered here that while the area of the region where the LDMOS (area defined by the gate electrode 36 and the outer periphery of the conductor pattern 38) is maintained, the width A is increased up to a desired width B for the improvement of the drain breakdown voltage. In this case, if the layout of FIG. 33 is maintained, the width W1 of the gate electrode 36 is decreased to the width W2 as the width A is increased to the width B (see FIG. 35).

In this point, the layout of FIG. 15 produces the effect that the width of the conductor pattern 38 can be increased to width B with the width W1 of the gate electrode 36 maintained, and a desired drain breakdown voltage can be obtained. From another view point, the effect that even when the width of the conductor pattern 38 is increased, the occupied area of the LDMOS can be prevented from being increased.

Figure 16:
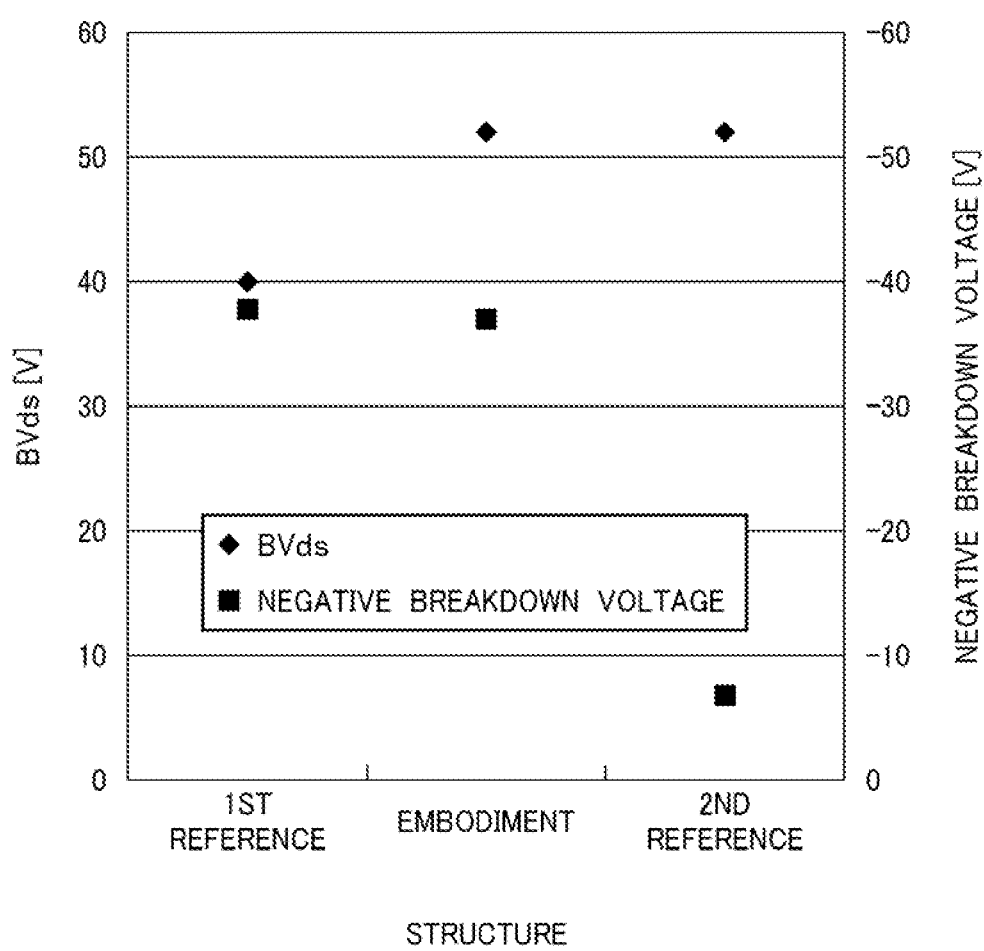
FIG. 16 is a graph illustrating the drain breakdown voltages and the negative breakdown voltages of the semiconductor device according to the embodiment, the semiconductor device of the first reference and the semiconductor device of the second reference.

FIG. 16 is the graph of the result of drain breakdown voltage and the negative breakdown voltage measured on the respective structures described above. In the graph, the plots indicated by the ♦ mark represent the drain breakdown voltage, and the plots indicated by the ■ mark represent the negative breakdown voltage.

The drain breakdown voltage BVds was defined as Vd given when Id becomes 100 nA in tracing the Vd from 0 V to 100 V with Vg=Vs=Vb=Vpsub=0 V. The negative breakdown voltage was defined as Vb given when Ib+Is+Ig becomes 100 nA in tracing Vg, Vs and Vb from 0 V to −100 V with Vd=Vpsub=0 V. Vg is a gate voltage to be applied to the gate electrode 36. Vs is a source voltage to be applied to the n-type source region 60. Vd is a drain voltage to be applied to the n-type drift region 18 via the n-type drain region 58. Vb is a back gate voltage to be applied to the p-type body region 26 via the p-type tap region 62. Vpsub is a substrate voltage to be applied to the silicon substrate 10 via the p-type contact region 64. Id, Ib, Is and Ig respectively represent a drain current a substrate current, a source current and a gate current.

As illustrated in FIG. 16, in the semiconductor device of the first reference, the drain breakdown voltage was about 40 V, and the negative breakdown voltage was about −38 V. In the semiconductor device of the second reference, the drain breakdown voltage could be improved to about 52 V, but the negative breakdown voltage lowered to about −7 V.

On the other hand, in semiconductor device according to the present embodiment, the drain breakdown voltage could be improved to about 52 V, which is equal to that of the semiconductor device of the second reference, and furthermore the negative breakdown voltage could be retained at about −37 V, which is equal to that of the semiconductor device of the first reference.

Next, the method of manufacturing the semiconductor device according to the present embodiment will be described with reference to FIGS. 17A to 32B.

FIGS. 17A-32B are cross-sectional views illustrating the method of manufacturing the semiconductor device according to the present embodiment. FIGS. 17A-22B are cross-sectional views along the A-A' line of FIG. 1. FIGS. 23A-28B are cross-sectional views along the B-B' line of FIG. 1. FIGS. 29A to 32B are cross-sectional views of the peripheral transistors in the steps of the manufacturing method.

First, a silicon oxide film 12 as a sacrificial oxidation film is formed above a p-type semiconductor substrate, e.g., a p-type silicon substrate 10 by, e.g., thermal oxidation method.

Next, a photoresist film 14 exposing a region for the n-type drift region 18 to be formed in is formed by photolithography.

Figure 17A:
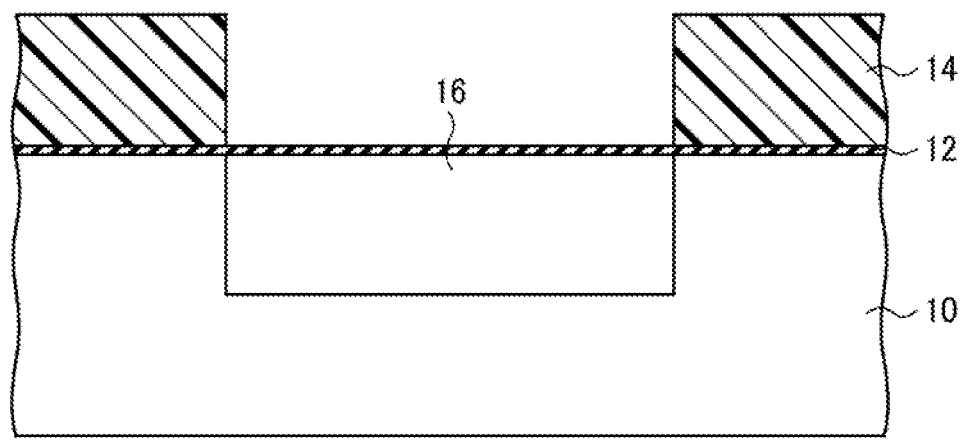
Figure 23A:
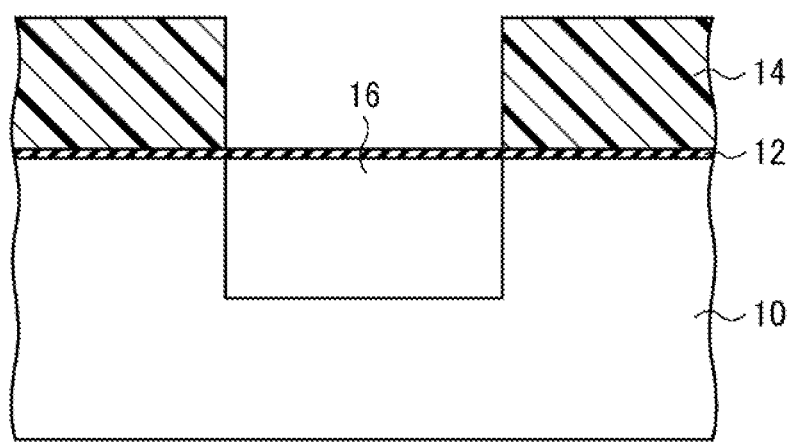

Next, with the photoresist film 14 as the mask, n-type impurity ions, such as phosphorus (P), arsenic (As) or others, are implanted to form the n-type impurity region 16 (FIGS. 17A and 23A). For example, phosphorus ions are implanted at, e.g., 2 MeV acceleration energy to the dose of, e.g., $5 \times 10^{12}$ cm$^{-2}$ to form the n-type impurity region 16.

Then, the photoresist film 14 is removed by, e.g., ashing method.

Figure 17B:
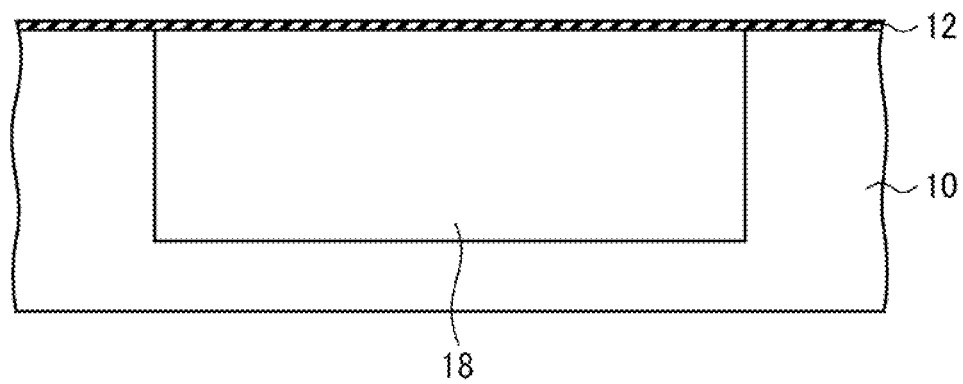
Figure 23B:
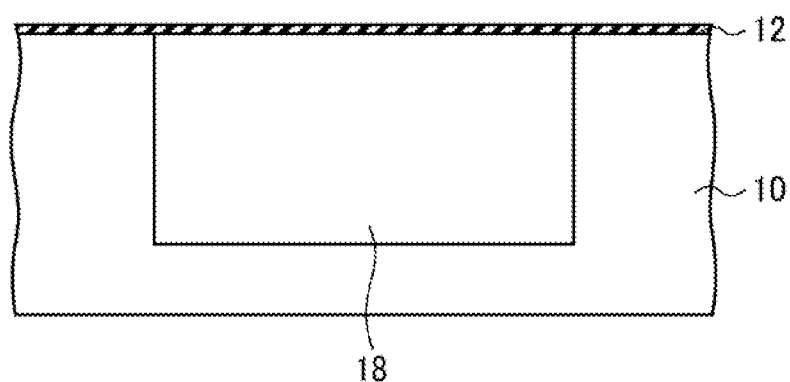

Then, thermal processing, e.g., of 1150° C. and 6 hours is made in an inert atmosphere, e.g., nitrogen atmosphere to diffuse and activate the impurity of the n-type impurity region 16 and form the n-type drift region 18 (FIGS. 17B and 23B).

Next, the device isolation insulating film 20 is formed by, e.g., STI (Shallow Trench Isolation) method in the surface side of the silicon substrate 10 with the n-type drift region 18 formed in. The depth of the device isolation insulating film 20 is not particularly limited but is about 200-400 nm, e.g., 300 nm.

Figure 24A:
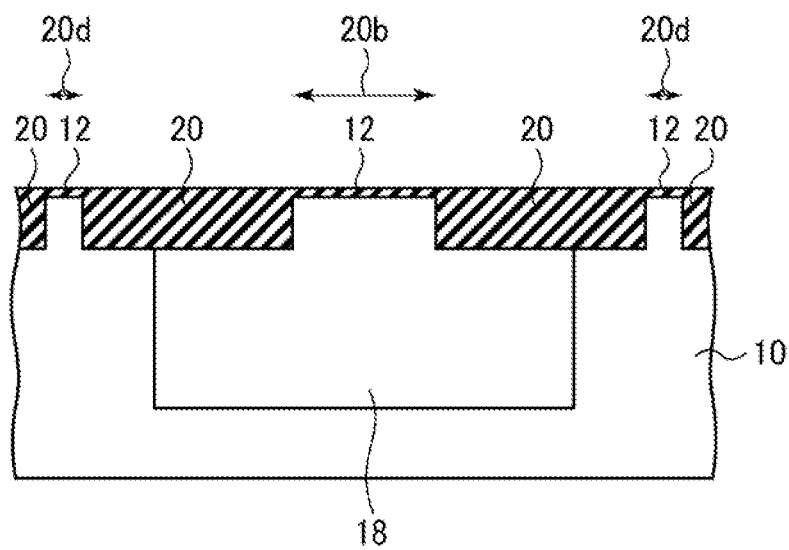
Figure 29A:
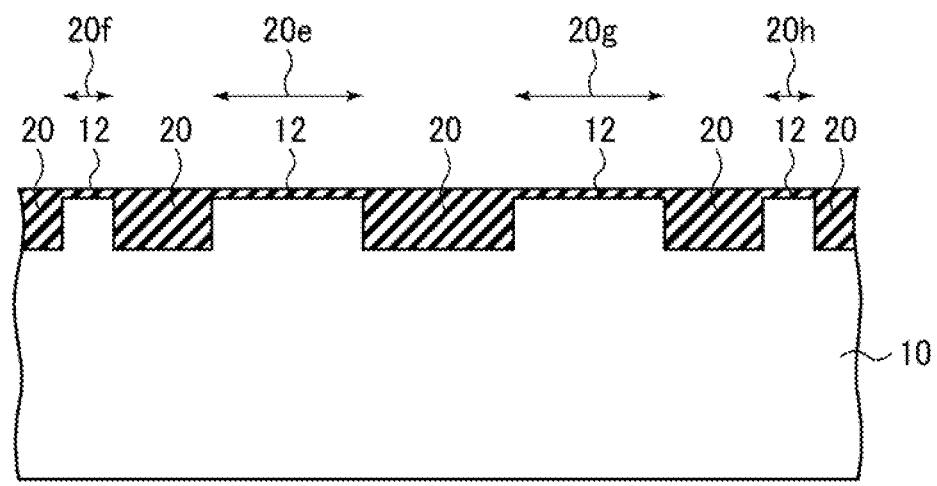

Thus, in the surface side of the silicon substrate 10, the active regions 20a, 20b, 20c, 20d, 20e, 20f, 20g, 20h, etc. are defined by the device isolation insulating film 20 (FIGS. 18A, 24A, 29A). The method of forming the device isolation insulating film 20 is not particularly limited and may be formed by, e.g., LOCOS (LOCal Oxidation of Silicon) method other than STI method.

The active regions 20a, 20b, 20c are correspond respectively to the n-type drain region, the n-type source region and the channel region, and the p-type tap region of the n-channel LDMOS transistor and are formed in the n-type drift region 18. The active region 20d corresponds to the substrate tap region laid out, enclosing the region for the n-channel LDMOS transistor to be formed in. The active region 20e corresponds to the region for the n-type low voltage transistor to be formed in. The active region 20f corresponds to the p-type contact region of the p-well for the n-type low voltage transistor to be formed in. The active region 20g corresponds to the p-type low voltage transistor to be formed in. The active region 20h corresponds to the n-type contact region of the n-well for the p-type low voltage transistor to be formed in.

The film covering the active regions 20a-20h after the device isolation insulating film 20 has been formed is not strictly the same as the silicon oxide film 12 and is another silicon oxide film formed in forming the device isolation insulating film 20 but is described as the silicon oxide film 12 to simplify the description.

Then, by photolithography, a photoresist film 22 exposing the region for the p-type body region 26 to be formed in is formed. The opening of the photoresist film contains the active region 20c and a part of the active region 20b as illustrated in FIGS. 18B and 24B.

Figure 24B:
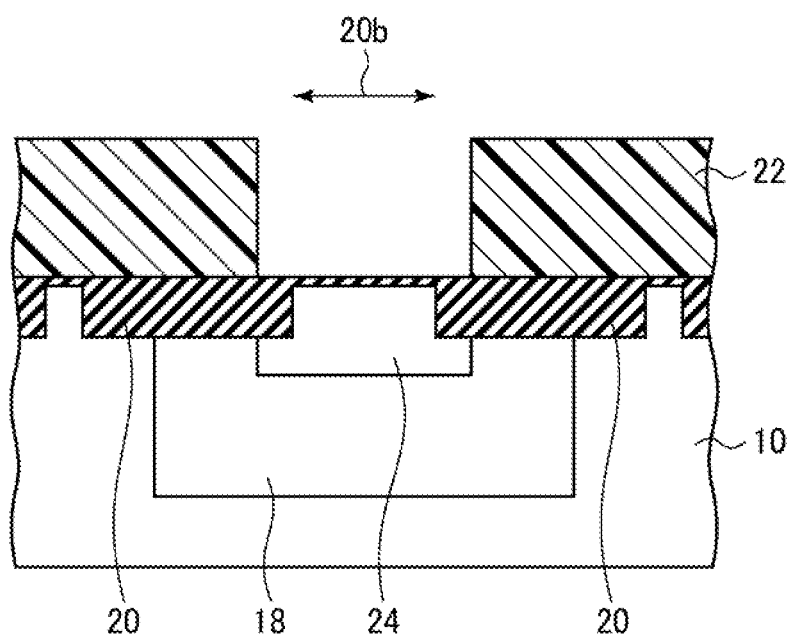

Then, with the photoresist film 22 as the mask, a p-type impurity ions, such as boron (B) or others, are implanted to form the p-type impurity region 24 in the region for the p-type body region to be formed in (FIGS. 18B and 24B). For example, boron ions are implanted at, e.g., 150 keV-500 keV acceleration energy to the dose of, e.g., $1 \times 10^{12}$ cm$^{-2}$–$3 \times 10^{12}$ cm$^{-2}$. This ion-implantation may be divided to be made plural times at different acceleration energies. For the threshold voltage control of the transistor, the impurity ions are also implanted at, e.g., 5 keV-30 keV acceleration energy to the dose of, e.g., $1 \times 10^{12}$ cm$^{-2}$.

Next, the photoresist film 22 is removed by, e.g., ashing method

Figure 19A:
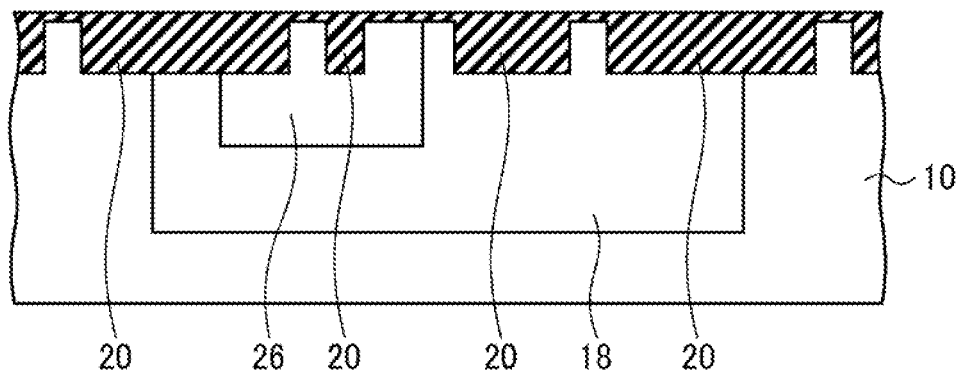
Figure 25A:
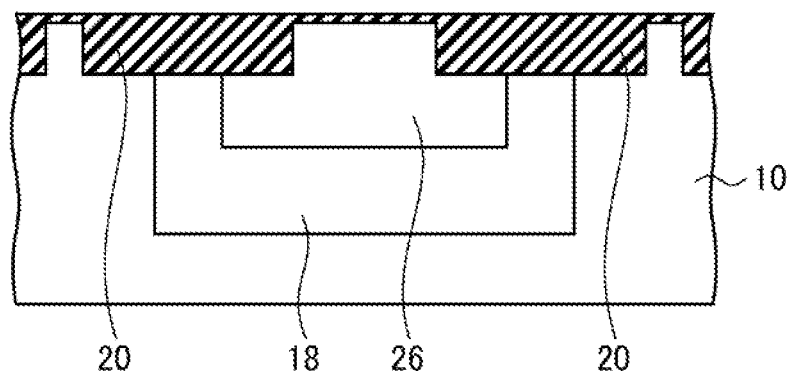

Next, thermal processing of, e.g., 1050° C. and minutes is made in an inert atmosphere, e.g., a nitrogen atmosphere to diffuse and activate the impurity of the p-type impurity region 24, and the p-type body region 26 is formed (FIGS. 19A and 25A).

Figure 19B:
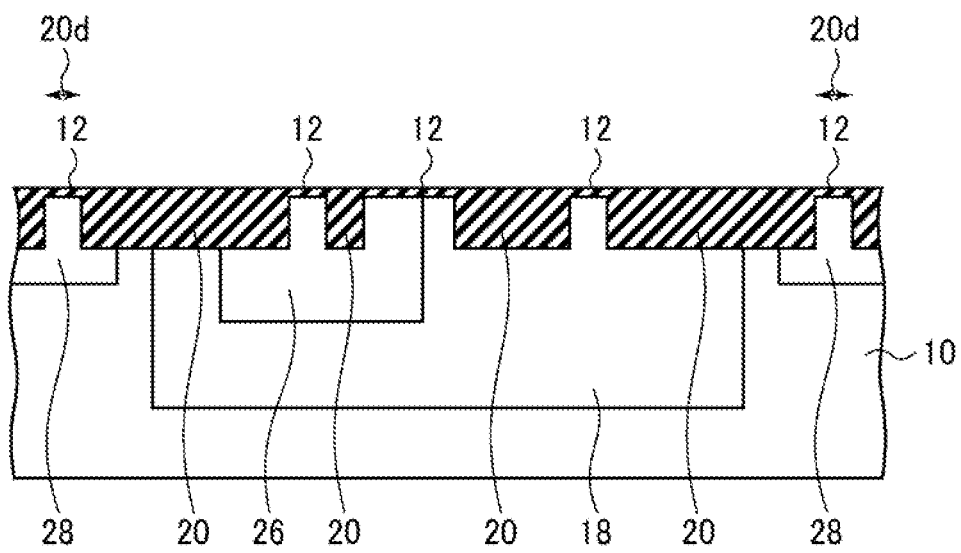
Figure 25B:
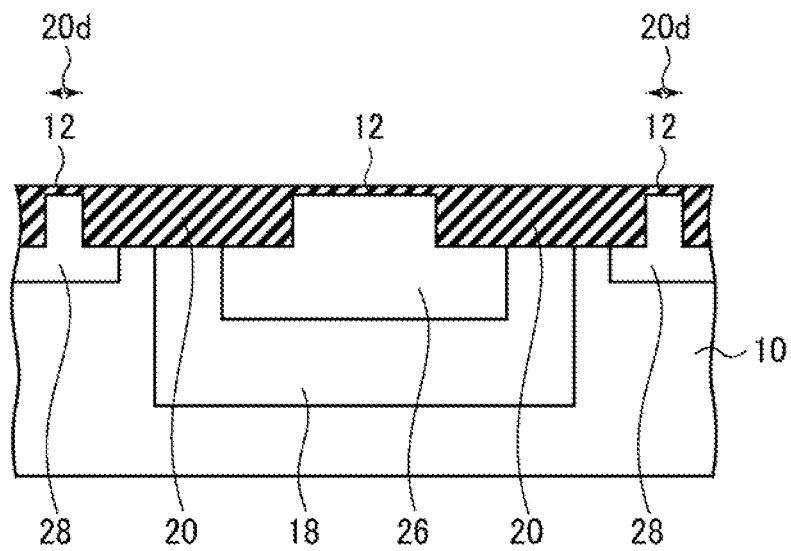
Figure 29B:
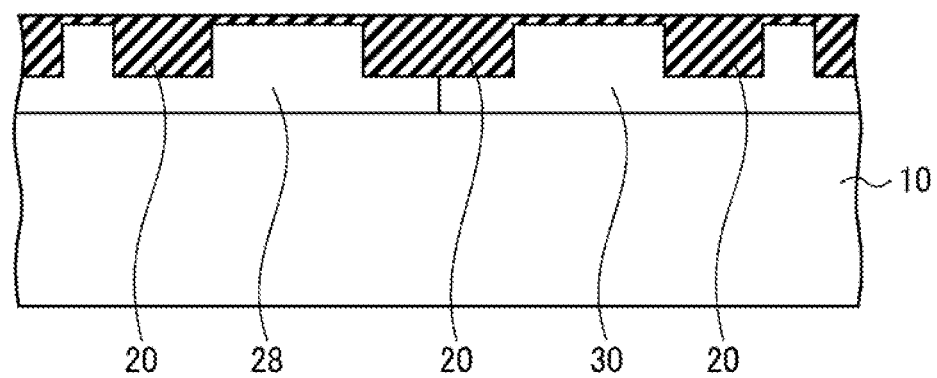

Then, in the same way, the p-well 28 and the n-well 30 are formed respectively in the region for the n-type low voltage transistor to be formed in and the region for the p-type low voltage transistor to be formed in. The p-well 28 is formed also in the substrate tap region (the active region 20d) enclosing the region for the n-channel LDMOS transistor to be formed in, spaced from the n-type drift region 18 (FIGS. 19B, 25B and 29B).

The thermal processing for forming the p-well 28 and the n-well 30 may be made together by the thermal processing for forming the p-type body region 26. The p-type drift region 18 may be formed after the device isolation insulating film 20 has been formed, as in forming the p-type body region 26.

Then, the silicon oxide film 12 formed on the surfaces of the active regions 20a-20h is removed by wet etching using, e.g., a hydrofluoric acid aqueous solution.

Figure 20A:
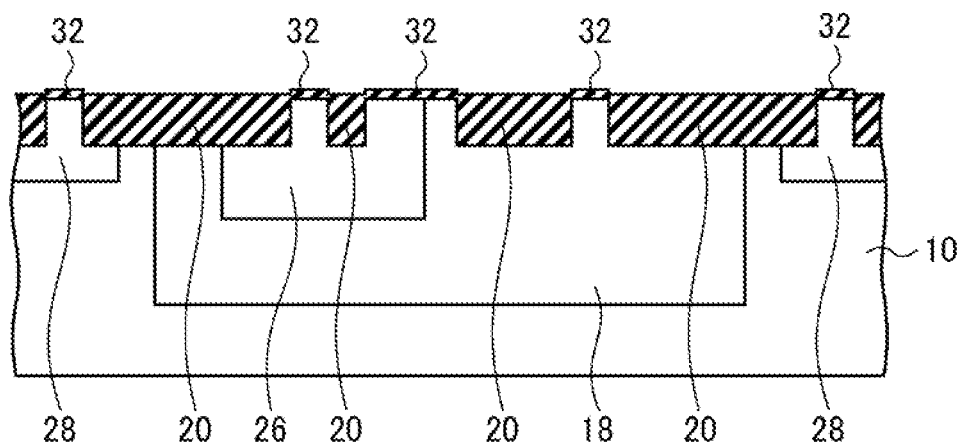
Figure 26A:
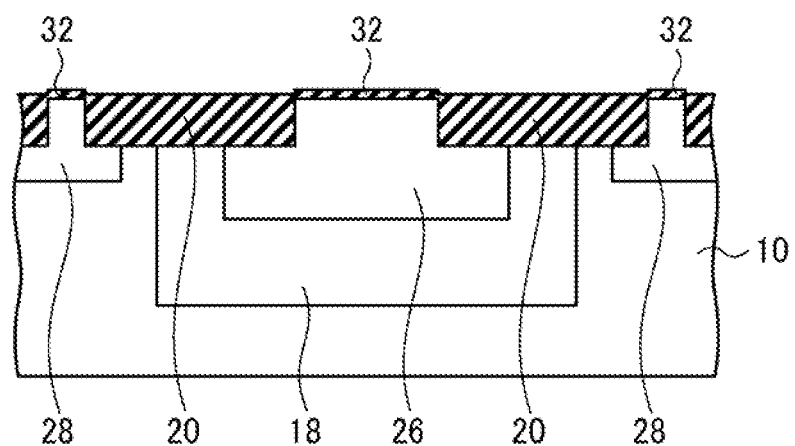
Figure 30A:
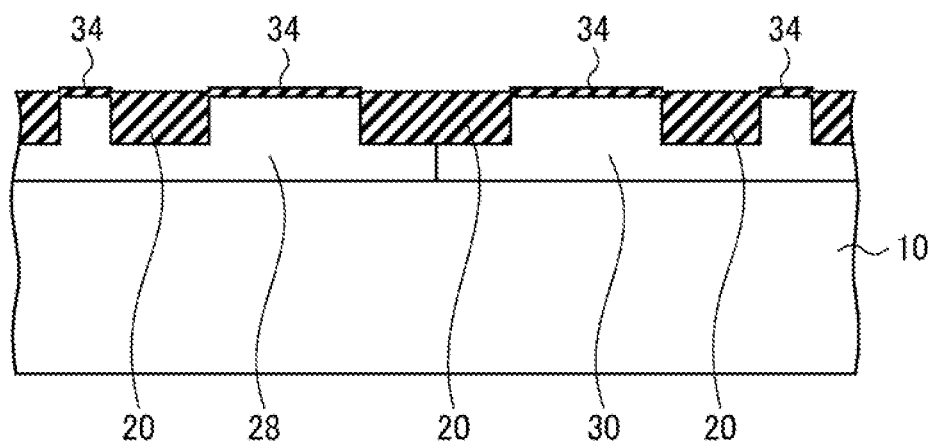

Next, by, e.g., thermal oxidation method, a silicon oxide film of, e.g., a 16 nm-thickness is grown in the region for the n-channel LDMOS transistor to be formed in to form the gate insulating film 32 (FIGS. 20A and 26A). A silicon oxide film is grown in the region for the low voltage transistor to be formed in to form the gate insulating film 34 (FIG. 30A). The film thicknesses of the gate insulating films 32, 34 are decided, based on the operational voltages of the respective transistors.

The method for forming the gate insulating films 32, 34 is not limited to thermal oxidation method and may be deposited by, e.g., CVD (chemical vapor deposition) method or others.

Then, a polycrystalline silicon film of, e.g., a 180 nm-thickness is deposited above the entire surface by, e.g., CVD method.

Figure 20B:
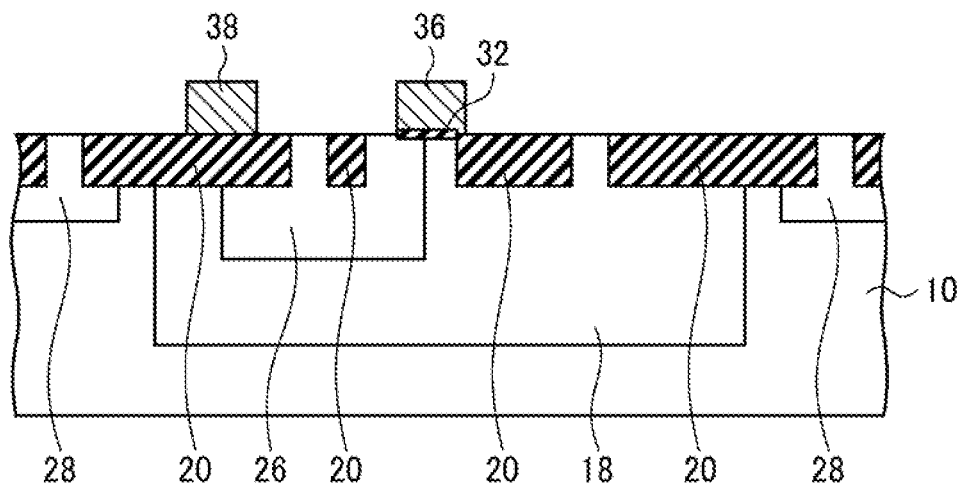
Figure 26B:
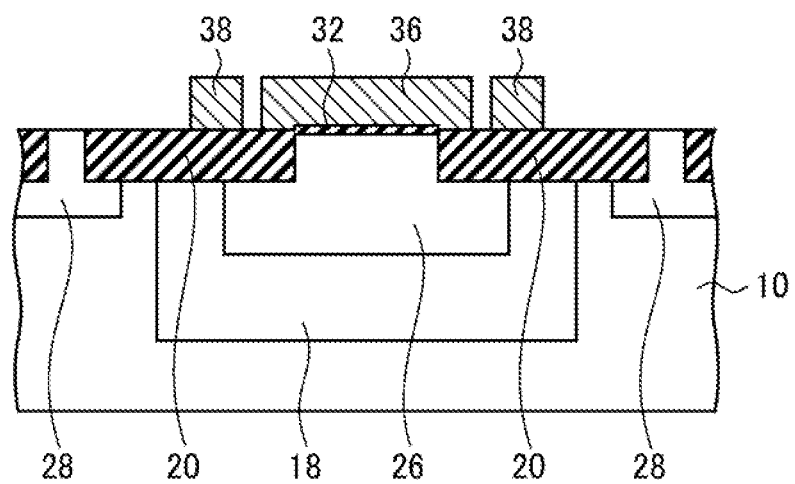
Figure 30B:
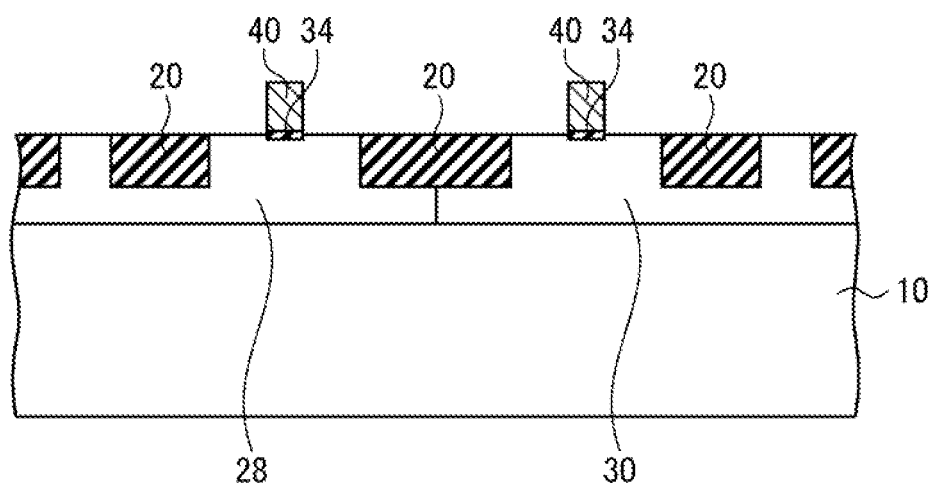

Next, the deposited polycrystalline silicon film is patterned by photolithography and dry etching to form the gate electrode 36 of the n-channel LDMOS transistor, the conductor pattern 38 and the gate electrodes 40 of the low voltage transistors (FIGS. 20B, 26B and 30B).

Next, a photoresist film 42 exposing the active regions 20a, 20b, 30e, 20h is formed by photolithography.

Figure 21A:
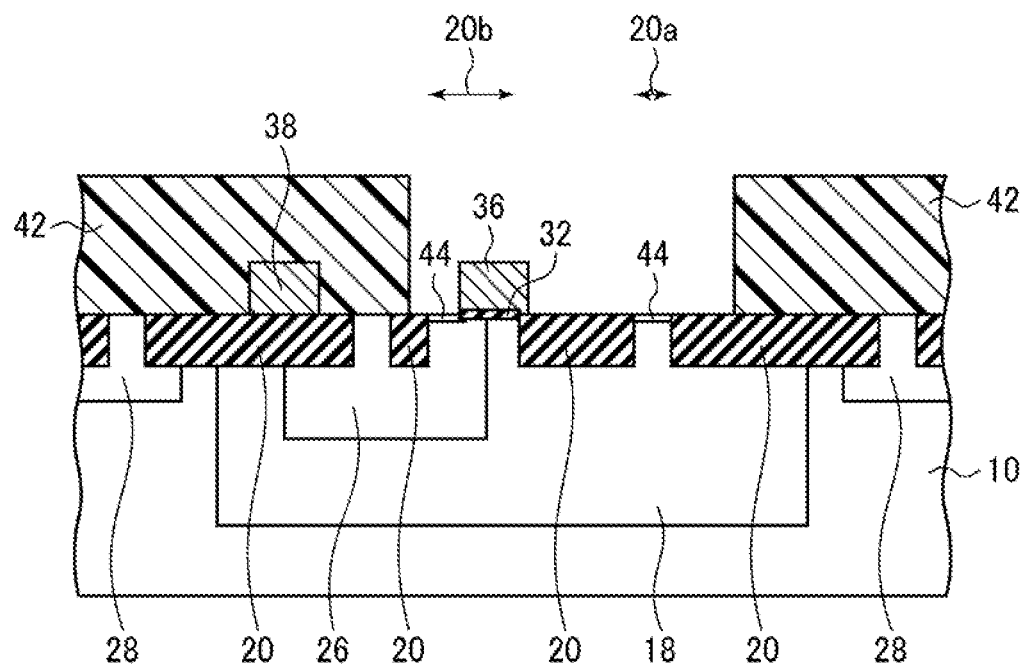
Figure 27A:
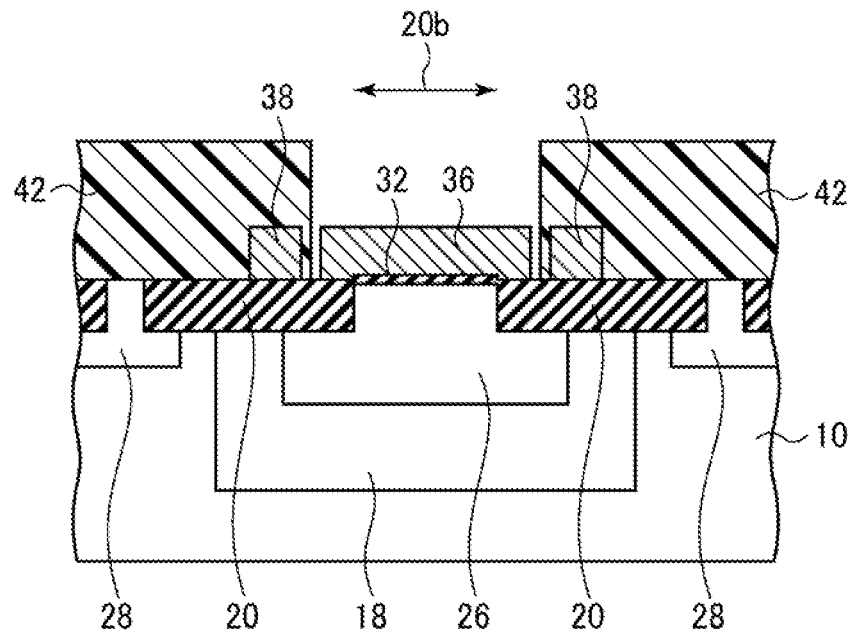
Figure 31A:
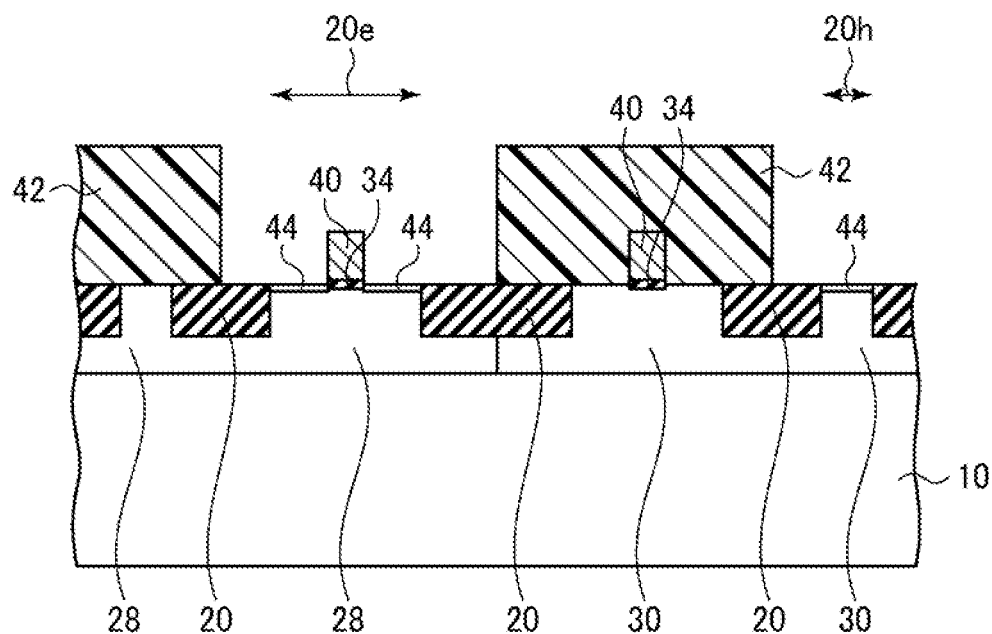

Then, by using as the mask the photoresist film 42, and the gate electrode 36 and the device isolation film 20 exposed out of the photoresist film 42, n-type impurity ions are implanted. Thus, the n-type impurity regions 44 to be the LDD region of the n-type transistor are formed (FIGS. 21A, 27A and 31A). The n-type impurity regions 44 are formed by implanting, e.g., phosphorus ions at, e.g., 10 keV-50 keV acceleration energy to the dose of, e.g., $1 \times 10^{13}$ cm$^{-2}$–$1 \times 10^{14}$ cm$^{-2}$.

Next, the photoresist film 42 is removed by, e.g., ashing method.

In the same way, by using as the mask the photoresist film (not illustrated) exposing the active regions 20c, 20d, 20f, 20g, and the gate electrode 36 and the device isolation insulating film 20 exposing out of the photoresist film, n-type impurity ions are implanted. Thus, the p-type impurity regions 46 to be the LDD regions of the p-type low voltage transistor are formed. The p-type impurity regions 46 are formed by implanting, e.g., boron ions at, e.g., 5 keV-20 keV acceleration energy to the dose of, e.g., $1 \times 10^{13}$ cm$^{-2}$–$1 \times 10^{14}$ cm$^{-2}$.

Then, the photoresist film (not illustrated) used in forming the p-type impurity region 46 is removed by, e.g., ashing method.

In the example described above, the impurity diffused regions for the LDD regions are formed in not only the source/drain regions of the transistors but also the active regions 20a, 20c, 20d, 20f, 20h, which are the contact regions but may not be essentially formed.

Then, a silicon oxide film is deposited by, e.g., CVD method, and then the silicon oxide film is etched back to form the sidewall insulating film 48 on the side walls of the gate electrodes 36, 40 and the conductor patterns 38.

Next, a photoresist film 50 exposing the active regions 20a, 20b, 20e, 20h is formed by photolithography.

Figure 21B:
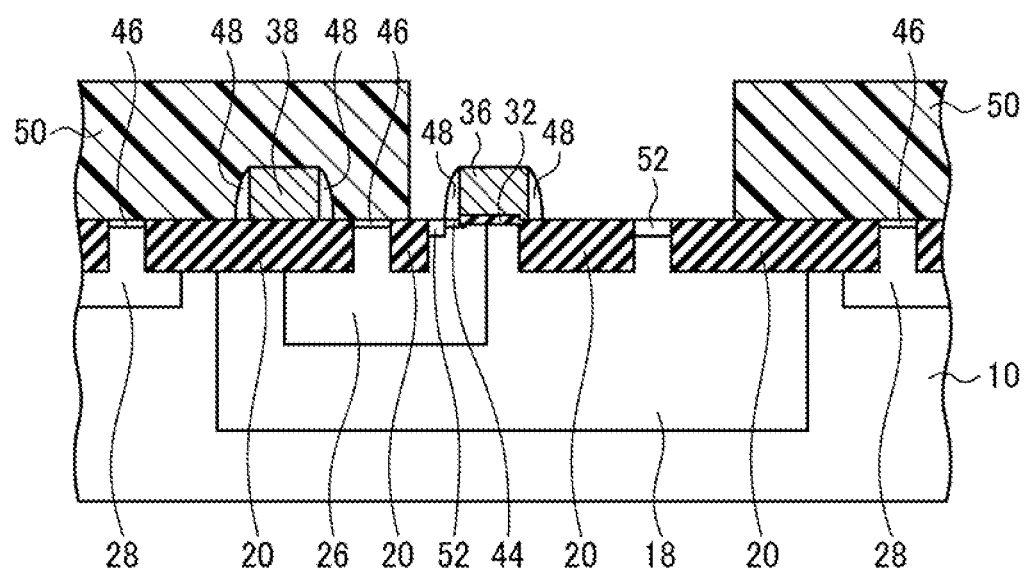
Figure 27B:
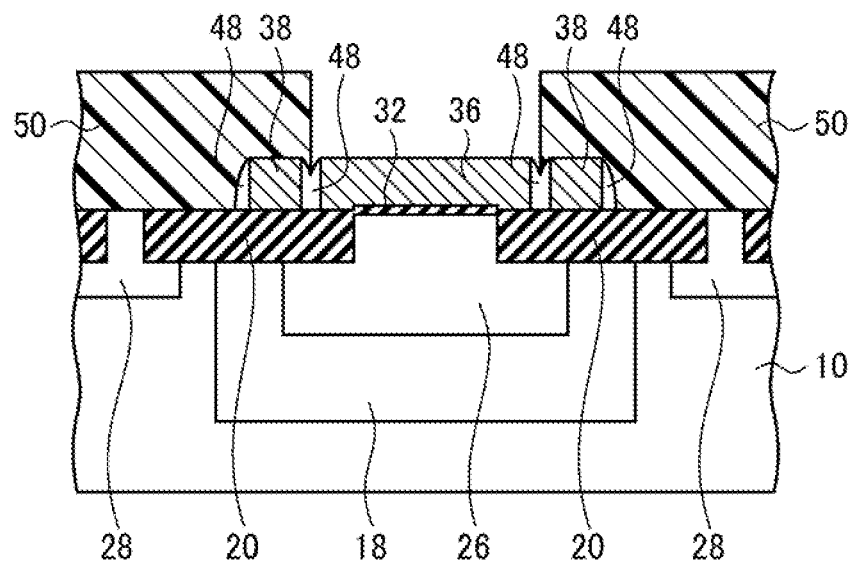
Figure 31B:
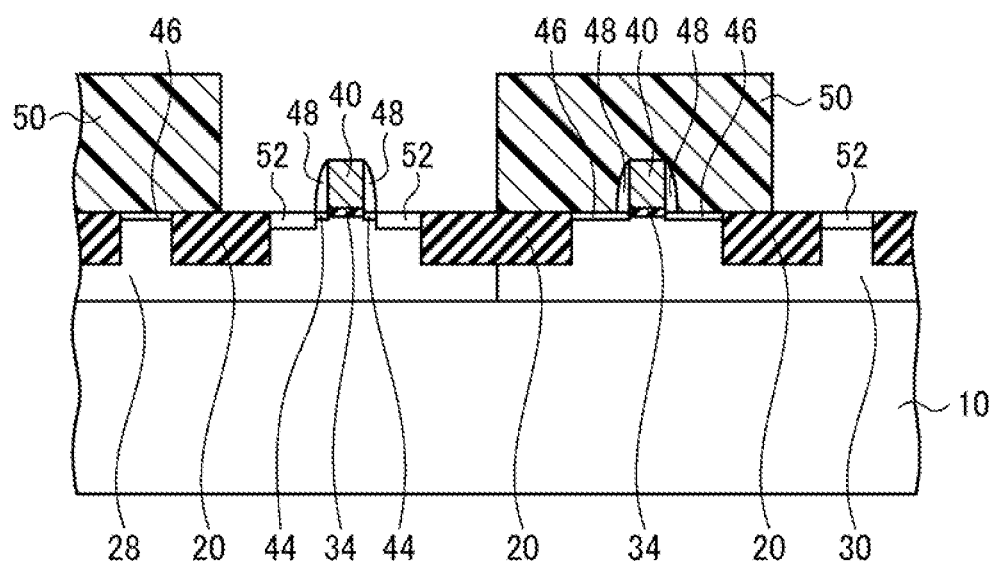

Then, by using as the mask the photoresist film 50, and the gate electrodes 36, 40, the sidewall insulating film 46 and the device isolation insulating film 20 exposing out of the photoresist film 50, an n-type impurity ions are implanted. Thus, the n-type impurity regions 52 are formed in the active regions 20a, 20b, 20e, 20h. (FIGS. 21B, 27B and 31B).

Next, the photoresist film 50 is removed by, e.g., ashing method.

Next, a photoresist film 54 exposing the active regions 20c, 20d, 20f, 20g is formed by photolithography.

Figure 22A:
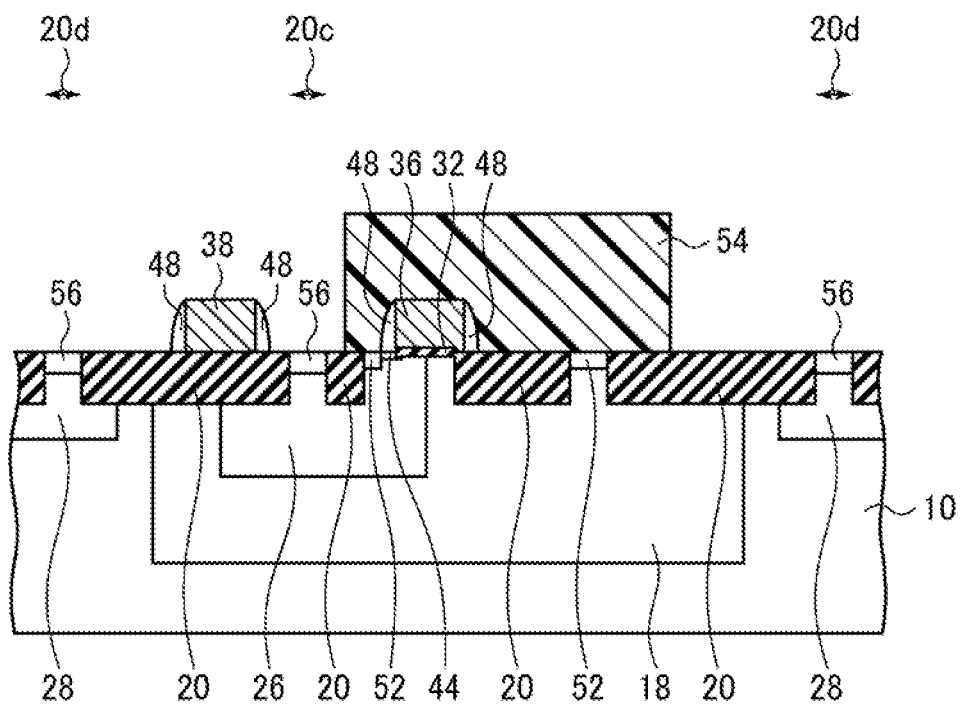
Figure 22B:
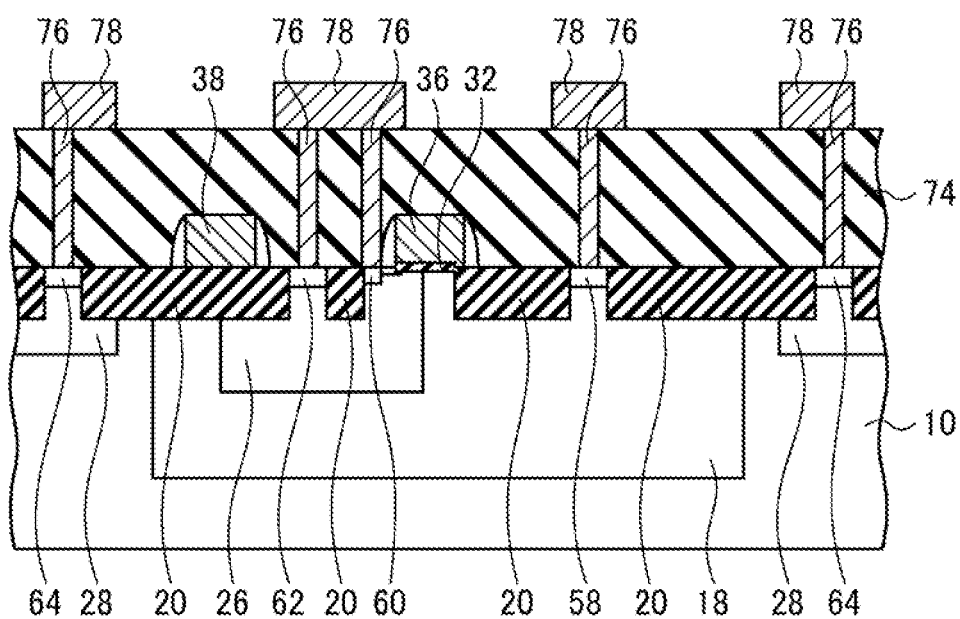
Figure 28A:
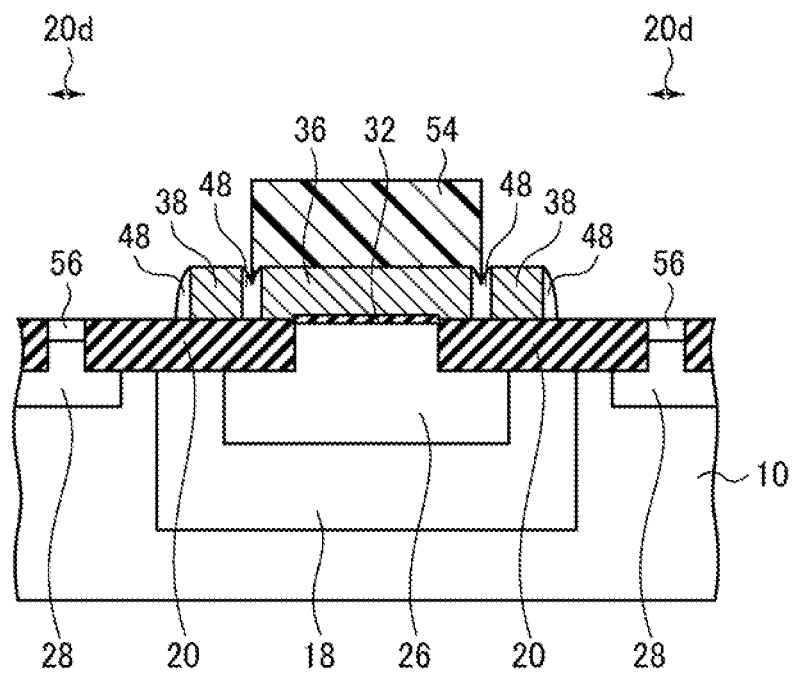
Figure 28B:
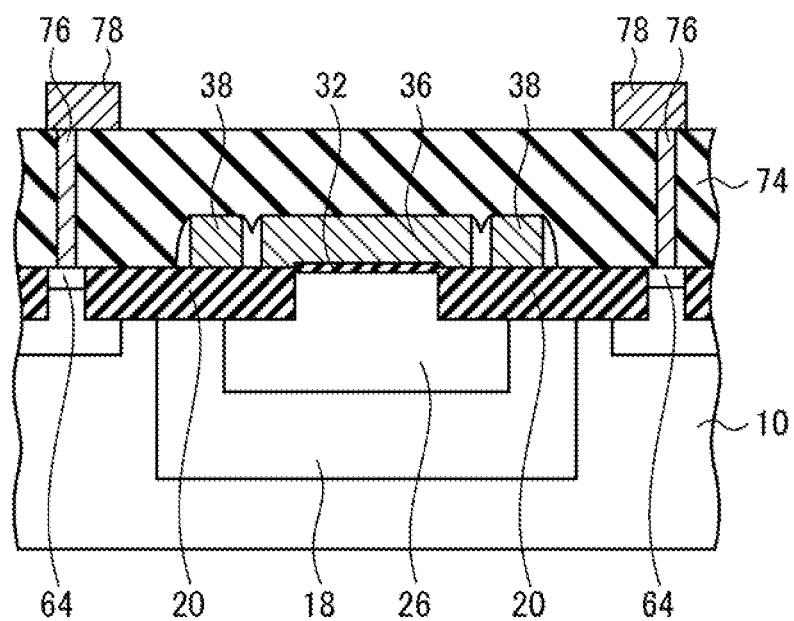
Figure 32A:
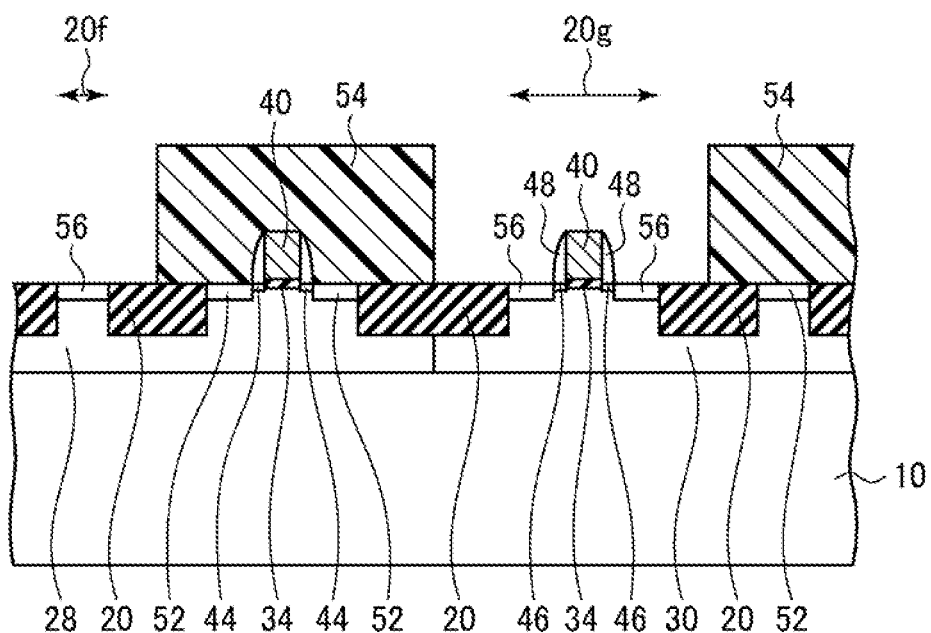
Figure 32B:
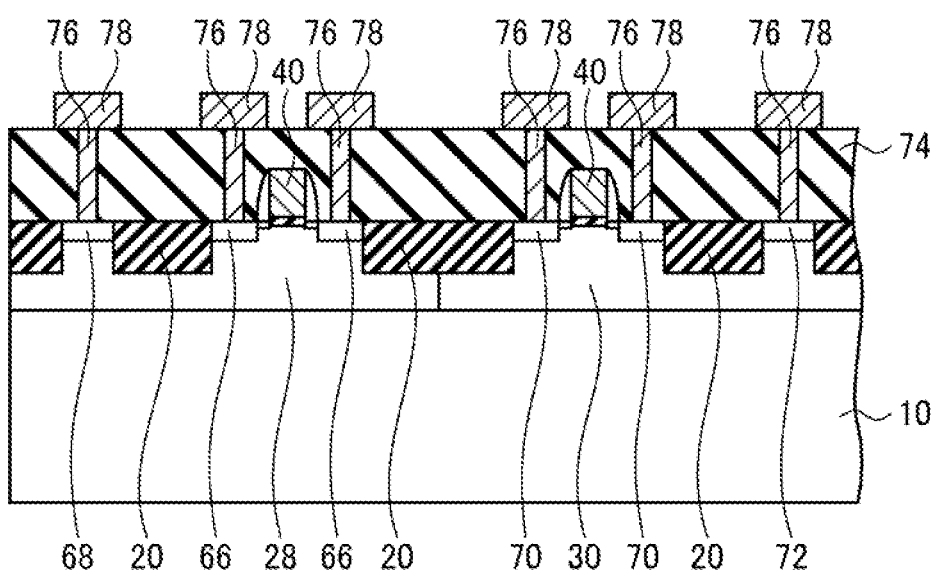

Then, by using as the mask the photoresist film 54, and the device isolation insulating film 20 exposed out of the photoresist film 54, a p-type impurity ions are implanted. Thus, the p-type impurity regions 56 are formed in the active regions 20c, 20d, 20f, 20g (FIGS. 22A, 28A and 32A).

Next, the photoresist film 54 is removed by, e.g., ashing method.

Then, thermal processing is made in an inert atmosphere, e.g., nitrogen atmosphere to active the implanted impurities. Thus, the n-type drain region 58 of the n-type impurity region 52 is formed in the surface side of the active region 20a. In the surface side of the active region 20b, the n-type source region 60 of the n-type impurity region 52 is formed. In the surface side of the active region 20c, the p-type tap region 62 of the p-type impurity region 56 is formed. In the surface side of the active region 20d, the p-type contact region 64 of the p-type impurity region 56 is formed. In the active region 20e, the n-type source/drain regions 66 of the n-type impurity regions 44, 52 are formed. In the surface side of the active region 20f, the p-type contact region 68 of the p-type impurity region 56 is formed. In the active region 20g, the p-type source/drain regions 68 of the p-type impurity regions 46, 56 are formed. In the surface side of the active region 20h, the n-type contact region 72 of the n-type impurity region 52 is formed.

Thus, the prescribed transistors are formed in the above-described prescribed regions on the silicon substrate 10.

Next, above the silicon substrate 10 with the transistors formed on, an insulating film is deposited by, e.g., CVD method to form the inter-layer insulating film 74.

Then, by the known interconnection forming process, the contact plugs 76 buried in the inter-layer insulating film 74, and the first level interconnection layer 78 connected to the respective terminals of the transistors via the contact plugs 76 are formed. The contact plugs 76 may be formed of tungsten (W), aluminum (Al), copper (Cu) or others. As the barrier metal for preventing the diffusion of such metal, titanium (Ti), tantalum (Ta) or others may be used. The interconnection layer 78 may be formed of tungsten, aluminum, copper or others, and as the barrier metal, titanium, tantalum or others can be used.

Hereafter, as required, a prescribed backend process, e.g., formation of the second level and the follower-interconnection layers, etc. are made, and the semiconductor device is completed.

As described above, according to the present embodiment, the drain breakdown voltage can be improved, and the negative breakdown voltage can be prevented from lowering. Accordingly, desired breakdown voltage can be realized in a wide variety of applications as the application as the general LDMOS transistor and the negative voltage resistant LDMOS transistor, etc., and the semiconductor device can have the performance improved.

The above-described embodiments can cover other various modifications.

For example, in the above-described embodiment, the n-channel LDMOS transistor is exemplified, but it is possible that the n-type conductivity type and the p-type conductivity type are inverted to form a p-channel LDMOS transistor. In this case, the same effects as described above can be obtained.

The plane and the cross-sectional configurations of the respective constituent parts, the constituent materials, the manufacturing conditions, etc. of the semiconductor device described in the above embodiment are only one example and can be suitably modified and changed in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
a semiconductor substrate of a first conductivity type;
a first region of a second conductivity type opposite to the first conductivity type formed in the semiconductor substrate;
a second region of the first conductivity type formed in the first region;
a source region of the second conductivity type formed in the second region;
a drain region of the second conductivity type formed in the first region;
a first junction part that includes a part of a border between the first region and the second region, and that is on the side of the drain region;
a second junction part that includes a part of the border between the first region and the second region, and that is at a location different from the first junction part;
a device isolation insulation film formed in the semiconductor substrate and located on the second junction part;
a gate electrode formed above the first junction; and
a conductor pattern formed on the device isolation insulation film and being electrically independent from the gate electrode, the source region and the drain region.

2. The semiconductor device according to claim 1, wherein the conductor pattern is electrically connected to the semiconductor substrate.

3. The semiconductor device according to claim 1, wherein the gate electrode has a first width, and
the conductor pattern has a second width larger than the first width.

4. The semiconductor device according to claim 1, wherein the gate electrode and the conductor pattern are circularly laid out, surrounding the second region.

5. The semiconductor device according to claim 1, wherein the conductor pattern includes a first part and a second part, the first part is positioned nearer the gate electrode than the second part,
the second part is connected to the first part, and
a width of the first part is smaller than a width of the second part.

6. The semiconductor device according to claim 1, wherein the source region is positioned remote from the first junction part by a first distance, and
the drain region is positioned remote from the first junction part by a second distance larger than the first distance.

7. The semiconductor device according to claim 1, wherein the gate electrode and the conductor pattern are formed of the same material.

8. A semiconductor device comprising:
a semiconductor substrate of a first conductivity type;
a first region of a second conductivity type opposite to the first conductivity type formed in the semiconductor substrate;
a second region of the first conductivity type formed in the first region;
a source region of the second conductivity type formed in the second region;
a drain region of the second conductivity type formed in the first region;
a first junction part that includes a part of a border between the first region and the second region, and that is on the side of the drain region;
a second junction part that includes a part of the border between the first region and the second region, and that is at a location different from the first junction part;
a gate electrode formed above the first junction; and
a conductor pattern formed above the second junction part and being electrically independent from the gate electrode,
wherein a first voltage is applied to the semiconductor substrate and the conductor pattern, and
a second voltage lower than the first voltage is applied to the second region.

9. The semiconductor device according to claim 8, wherein the conductor pattern is electrically connected to the semiconductor substrate.

10. The semiconductor device according to claim 8, wherein
the gate electrode has a first width, and
the conductor pattern has a second width larger than the first width.

11. The semiconductor device according to claim 8, wherein
the gate electrode and the conductor pattern are circularly laid out, surrounding the second region.

12. The semiconductor device according to claim 8, wherein
the conductor pattern includes a first part and a second part,
the first part is positioned nearer the gate electrode than the second part,
the second part is connected to the first part, and
a width of the first part is smaller than a width of the second part.

13. The semiconductor device according to claim 8, wherein
a device isolation insulation film formed in the semiconductor substrate and located on the second junction part,
wherein the conductor pattern is located on the device isolation insulation film.

14. The semiconductor device according to claim 8, wherein
the source region is positioned remote from the first junction part by a first distance, and
the drain region is positioned remote from the first junction part by a second distance larger than the first distance.

15. The semiconductor device according to claim 8, wherein
the gate electrode and the conductor pattern are formed of the same material.

16. The semiconductor device according to claim 1, wherein
the second junction part is connected to the device isolation insulation film.

17. The semiconductor device according to claim 13, wherein
the second junction part is connected to the device isolation insulation film.

* * * * *